United States Patent
Liang et al.

(10) Patent No.: US 8,802,214 B2
(45) Date of Patent: Aug. 12, 2014

(54) NON-RANDOM ARRAY ANISOTROPIC CONDUCTIVE FILM (ACF) AND MANUFACTURING PROCESSES

(75) Inventors: Rong-Chang Liang, Cupertino, CA (US); Jerry Chung, Mountain View, CA (US); Chinjen Tseng, Freemont, CA (US); Shuji Rokutanda, Fremont, CA (US); Yuhao Sun, Newark, CA (US); Hsiao-Ken Chuang, Sunnyvale, CA (US)

(73) Assignee: Trillion Science, Inc., Fremont, CA (US)

( * ) Notice: Subject to any disclaimer, the term of this patent is extended or adjusted under 35 U.S.C. 154(b) by 1262 days.

(21) Appl. No.: 12/608,955

(22) Filed: Oct. 29, 2009

(65) Prior Publication Data

US 2010/0101700 A1    Apr. 29, 2010

Related U.S. Application Data

(63) Continuation-in-part of application No. 11/418,414, filed on May 3, 2006, now abandoned.

(60) Provisional application No. 60/690,406, filed on Jun. 13, 2005.

(51) Int. Cl.
*B32B 3/10* (2006.01)

(52) U.S. Cl.
USPC ............................. 428/133; 355/403; 349/86

(58) Field of Classification Search
None
See application file for complete search history.

(56) References Cited

U.S. PATENT DOCUMENTS

| | | |
|---|---|---|
| 4,247,234 A | 1/1981 | Hoffman |
| 4,606,962 A | 8/1986 | Reylek et al. |
| 4,740,657 A | 4/1988 | Tsukagoshi et al. |
| 4,877,761 A | 10/1989 | Chmiel et al. |
| 5,087,494 A | 2/1992 | Calhoun et al. |
| 5,136,359 A | 8/1992 | Takayama et al. |
| 5,141,790 A | 8/1992 | Calhoun et al. |
| 5,162,087 A | 11/1992 | Fukuzawa et al. |
| 5,163,837 A | 11/1992 | Rowlette, Sr. |
| 5,216,065 A | 6/1993 | Coyler et al. |

(Continued)

FOREIGN PATENT DOCUMENTS

| | | |
|---|---|---|
| CN | 1307625 | 8/2001 |
| EP | 1168373 B1 | 1/2006 |

(Continued)

OTHER PUBLICATIONS

PCT, International Search Report and Written Opinion, International Application No. PCT/US2012/054375 (Jun. 24, 2013).

(Continued)

*Primary Examiner* — Wensing Kuo
(74) *Attorney, Agent, or Firm* — Thompson Hine L.L.P.

(57) ABSTRACT

Structures and manufacturing processes of an ACF array using a non-random array of microcavities of predetermined configuration, shape and dimension. The manufacturing process includes fluidic filling of conductive particles onto a substrate or carrier web comprising a predetermined array of microcavities, or selective metallization of the array followed by filling the array with a filler material and a second selective metallization on the filled microcavity array. The thus prepared filled conductive microcavity array is then over-coated or laminated with an adhesive film. Cavities in the array, and particles filling the cavities, can have a unimodal, bimodal, or multimodal distribution.

73 Claims, 20 Drawing Sheets

(56) References Cited

U.S. PATENT DOCUMENTS

| | | |
|---|---|---|
| 5,219,462 A | 6/1993 | Bruxvoort et al. |
| 5,275,856 A | 1/1994 | Calhoun et al. |
| 5,300,340 A | 4/1994 | Calhoun et al. |
| 5,330,684 A | 7/1994 | Emori et al. |
| 5,366,140 A | 11/1994 | Koskenmaki et al. |
| 5,437,754 A | 8/1995 | Calhoun |
| 5,438,223 A | 8/1995 | Higashi et al. |
| 5,486,427 A | 1/1996 | Koskenmaki et al. |
| 5,487,707 A | 1/1996 | Sharf et al. |
| 5,522,962 A | 6/1996 | Koskenmaki et al. |
| 5,533,447 A | 7/1996 | Johnson et al. |
| 5,613,862 A | 3/1997 | Naylor |
| 5,672,400 A | 9/1997 | Hansen et al. |
| 5,769,996 A | 6/1998 | McArdle et al. |
| 5,820,450 A | 10/1998 | Calhoun |
| 5,839,188 A | 11/1998 | Pommer |
| 5,851,644 A | 12/1998 | McArdle et al. |
| 5,882,802 A | 3/1999 | Ostolski |
| 5,916,641 A | 6/1999 | McArdle et al. |
| 6,011,307 A | 1/2000 | Jiang et al. |
| 6,042,894 A | 3/2000 | Goto et al. |
| 6,120,946 A | 9/2000 | Johnson et al. |
| 6,180,226 B1 | 1/2001 | McArdle et al. |
| 6,214,460 B1 | 4/2001 | Bluem |
| 6,274,508 B1 | 8/2001 | Jacobsen et al. |
| 6,281,038 B1 | 8/2001 | Jacobson et al. |
| 6,352,775 B1 | 3/2002 | Sasaki et al. |
| 6,402,876 B1 | 6/2002 | McArdle et al. |
| 6,423,172 B1 | 7/2002 | McArdle et al. |
| 6,555,408 B1 | 4/2003 | Jacobson et al. |
| 6,566,744 B2 | 5/2003 | Gengel |
| 6,632,532 B1 | 10/2003 | Yamada et al. |
| 6,671,024 B1 | 12/2003 | Uchiyama |
| 6,672,921 B1 | 1/2004 | Liang et al. |
| 6,683,663 B1 | 1/2004 | Hadley et al. |
| 6,751,008 B2 | 6/2004 | Liang et al. |
| 6,770,369 B1 | 8/2004 | Oyamada et al. |
| 6,784,953 B2 | 8/2004 | Liang et al. |
| 6,788,452 B2 | 9/2004 | Liang et al. |
| 6,833,943 B2 | 12/2004 | Liang et al. |
| 6,834,612 B2 | 12/2004 | Chambers |
| 6,884,833 B2 | 4/2005 | Chheang et al. |
| 6,906,427 B2 | 6/2005 | Tanaka et al. |
| 7,291,393 B2 | 11/2007 | Wakiya et al. |
| 7,923,488 B2 | 4/2011 | Xu et al. |
| 2001/0008169 A1* | 7/2001 | Connell et al. ............ 156/298 |
| 2005/0118845 A1 | 6/2005 | Kobayashi et al. |
| 2006/0054867 A1 | 3/2006 | Yamada |
| 2006/0280912 A1 | 12/2006 | Liang et al. |
| 2007/0175579 A1 | 8/2007 | Otani et al. |
| 2008/0164812 A1 | 7/2008 | Tsai et al. |
| 2008/0191174 A1 | 8/2008 | Ehrensvard et al. |
| 2009/0053859 A1 | 2/2009 | Xu et al. |
| 2009/0181165 A1 | 7/2009 | Liang et al. |
| 2010/0317545 A1 | 12/2010 | McNamara et al. |
| 2011/0114256 A1 | 5/2011 | Otani et al. |

FOREIGN PATENT DOCUMENTS

| | | |
|---|---|---|
| JP | 63-91907 | 4/1988 |
| JP | 07173667 | 7/1995 |
| JP | 2002519473 | 7/2002 |
| JP | 2003220669 | 8/2003 |
| JP | 2007-224111 | 9/2007 |
| JP | 2009-029862 | 2/2009 |
| JP | 2011-026539 | 2/2011 |
| KR | 10-0377603 | 11/2003 |
| WO | WO 00/00563 | 1/2000 |
| WO | WO 2007/130127 | 11/2007 |
| WO | WO 2007/130137 | 11/2007 |

OTHER PUBLICATIONS

Asai, S., et al. "Devlopment of an Anisotropic Conductive adhesive file (ACAF) from Epoxy Resins", Journal of Applied Polymer Science, vol. 56 (1995) p. 769-777, John Wiley.

Dokoutchaev, A. et al., "Colloidal Metal Deposition onto Functionalized Polystyrene Microspheres", Chem. Matter 1999, 11, p. 2389-2399, American Chem. Society.

Ishibashi, K et al. "A New Anisotropic Conductive File with Arrayed Conductive Particles", IEEE Trans on Components, Packaging & Mfg Tech. Part B, V. 18/No. 4, Nov. 1996, 752-757.

Gendel, "A Process for the Manufacture of Cost Competitive MCM Substrates" MCM'94 Proceedings, 1994 pp. 182-187.

Mescher, P, et al. "Applications Specific Flip Chip Packages; Considerations and Options in Using FCIP", Pan Pacific Microelect. Symposim Conferebce, Jan. 2000.

Ugelstad, et al. "Biomedical Applications of Monodisperse Magnetic Polymer Particles" Future Directions in Polymer Colloids (1987) p. 355 El-ssser and Fitch (ed.) Martinus Nij.

Ugelstad, et al. "Preparation and Application of Monodisperse Polymer Particles" Journal of Polymer Science 72, (1985), p. 225-240.

Ugelstad, et al. Swelling of Olgiorner-Polymer Particles, New Methods of Preparation of Emulsions and Polymer Disperson; Advances in Colloid and Interface Science, 13 (1980) p.

Yamaguchi, et al. "Cupll-T Anisotropic Conductive Film for Testing" Nitto Giho, vol. 40. Sep. 2002, p. 17-20.

Nuzzo, R.G. et al., "Adsorption of Bifunctional Organic Disulfiedes on Gold Surfaces," *J. Am. Chem. Soc.*, 105, pp. 4481-4483 (1983).

Office Action (with English translation), Taiwanese Application No. 095146567, Sep. 26, 2013.

Office Action, U.S. Appl. No. 11/418,414 (Oct. 19, 2007).

Office Action, U.S. Appl. No. 11/418,414 (Apr. 30, 2008).

Office Action, U.S. Appl. No. 11/418,414 (Oct. 29, 2008).

Office Action, U.S. Appl. No. 11/418,414 (Apr. 30, 2009).

Office Action, U.S. Appl. No. 12/220,960 (Jun. 12, 2009).

International Search Report, International Application No. PCT/US2006/042229 (mailed Jun. 17, 2008, published Nov. 15, 2007).

International Preliminary Report on Patentability, International Application No. PCT/US2006/042229 (Mar. 24, 2009).

International Search Report, International Application No. PCT/US2006/046807 (mailed Feb. 2, 2009, published Nov. 15, 2007).

International Preliminary Report on Patentability, International Application No. PCT/US2006/046807 (Mar. 30, 2009).

Notice of the Reason for Rejection (with English translation), Korean Application No. 2008-7028483 (May 27, 2013).

International Search Report and Written Opinion, International Application No. PCT/US2012/054375 (Jun. 24, 2013).

Liang, R-C. et al., "Fixed-Array Anisotropic Conductive Film (FACF) for Ultra Fine Pitch Applications," ICFPE Proceedings, Paper S1-2-4, Hsinchu, Taiwan (2010).

Liang, R.-C. et al., "Ultra Fine Pitch Anisotropic Conductive Film with Fixed Array of Conductive Particles," IDW'10 Proceeding, p. 1909, Paper FMC4-4, Fukuoka, Japan (2010).

"Ultra-Fine Pitch Fixed Array ACF," Tech on Chinese (Mar. 1, 2011).

EP, Extended Search Report, European Application No. 06844998.2 (Jun. 14, 2012).

EP, Supplemental Search Report, European Application No. 06844998.2 (Feb. 20, 2012).

\* cited by examiner

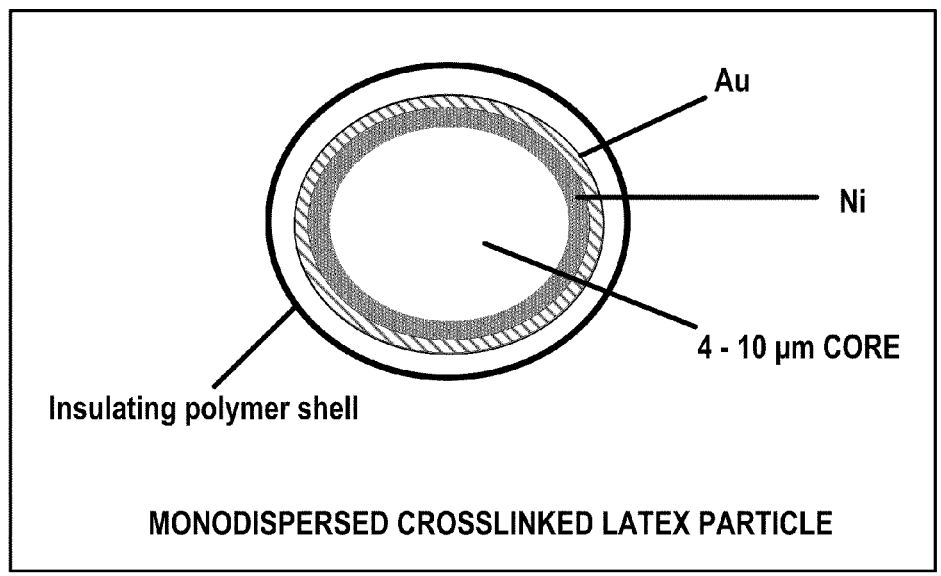
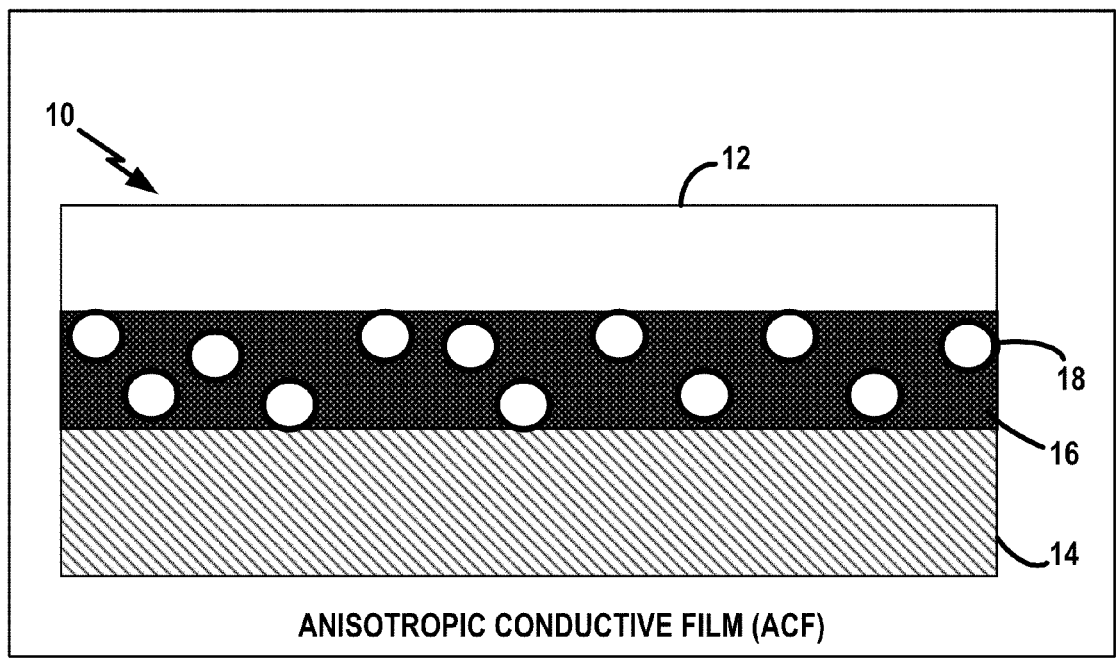
Figure 1A
PRIOR ART

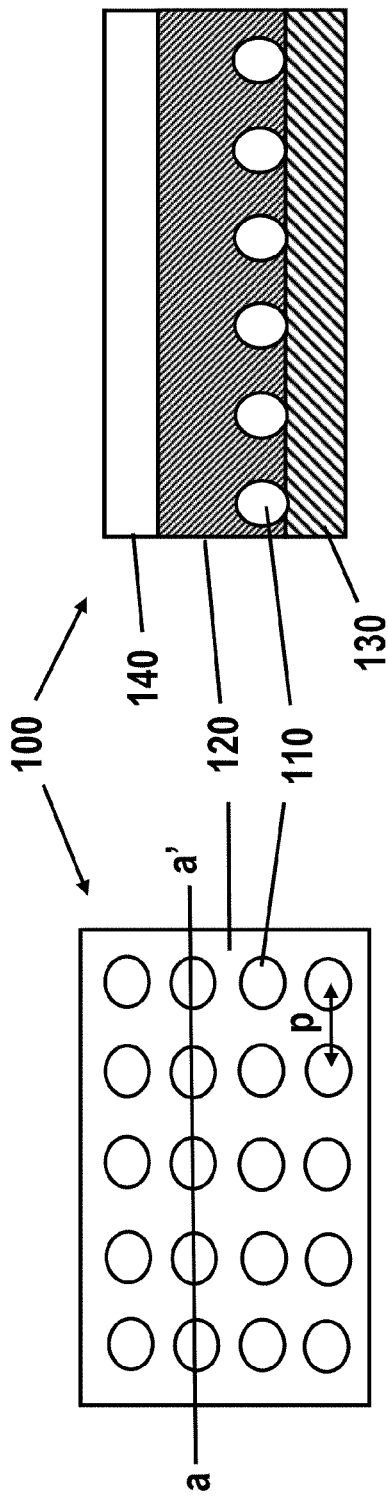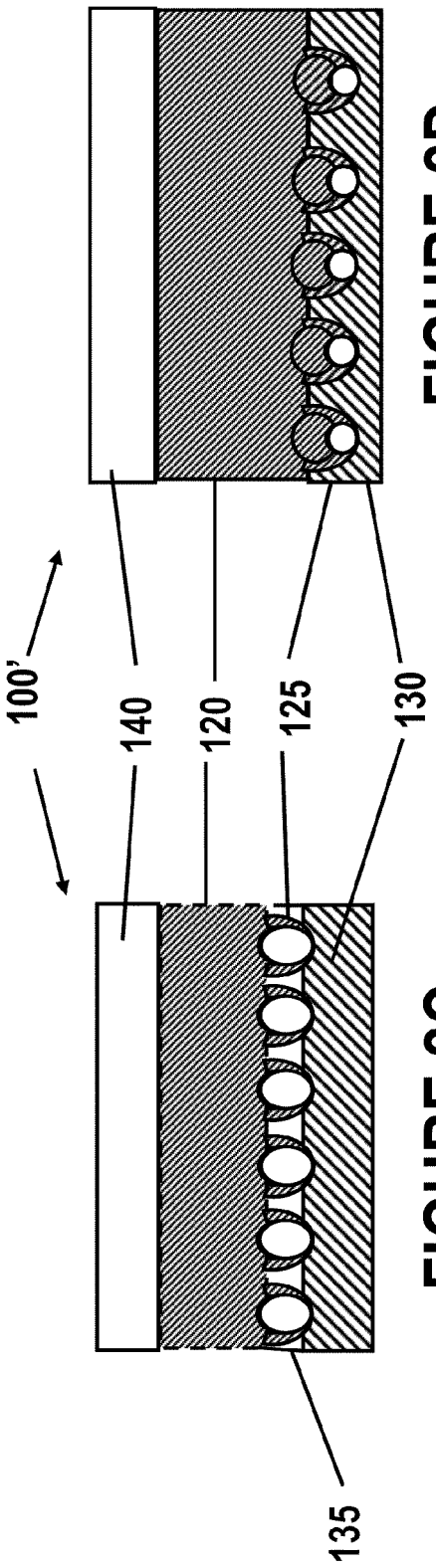

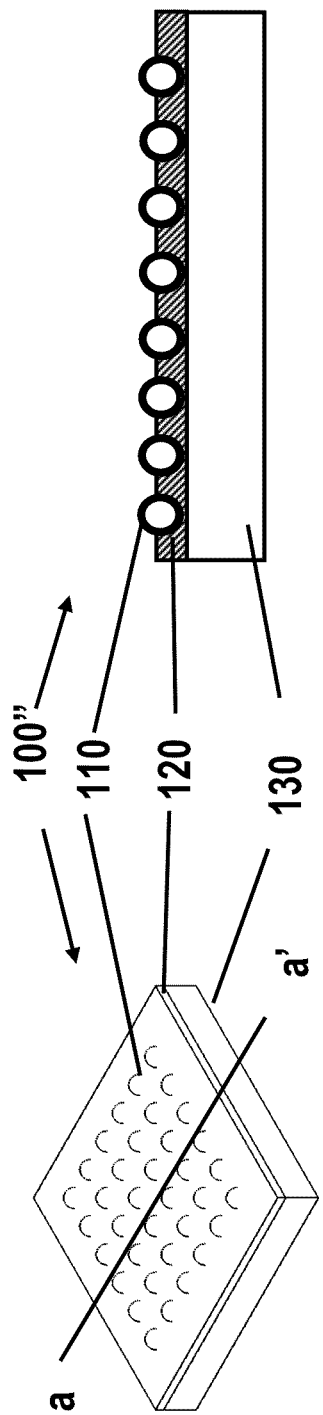

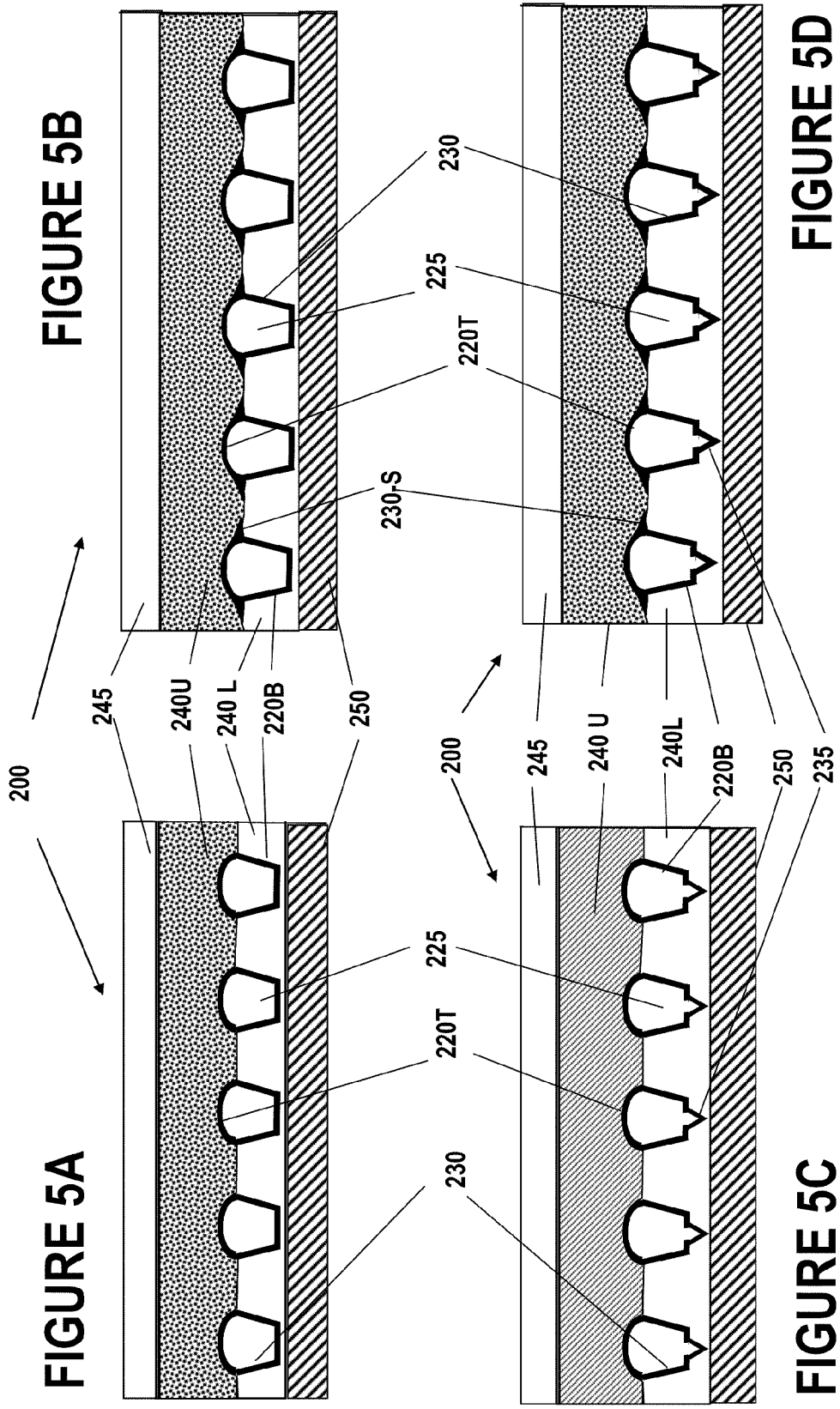

FIGURE 6A-1
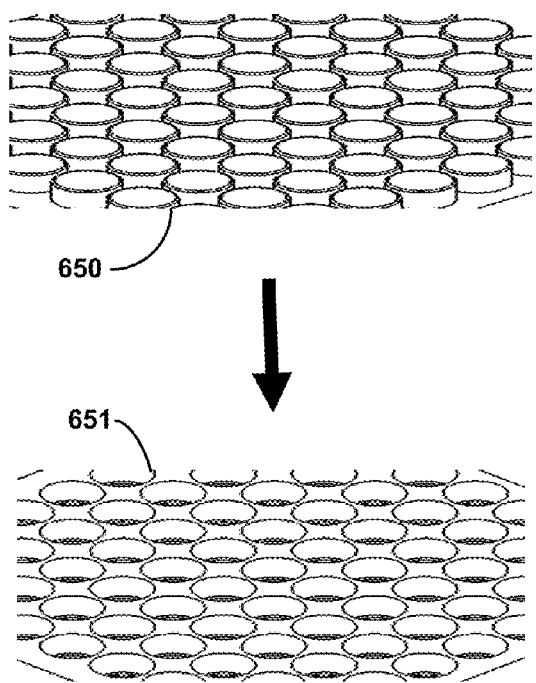
650
FIGURE 6A-2
651
FIGURE 6B-1
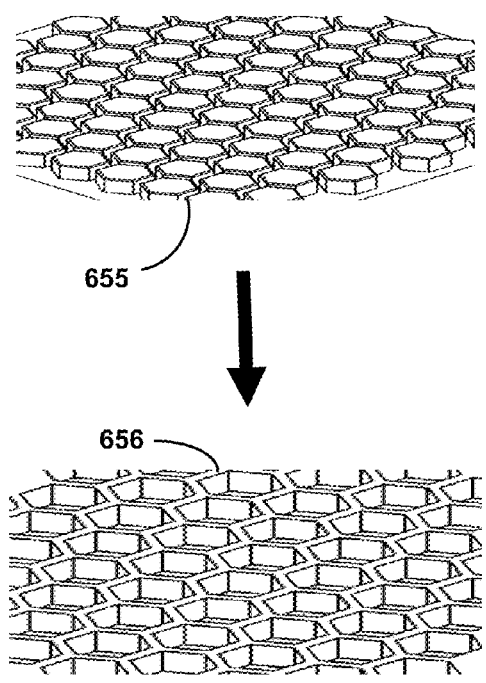
655
FIGURE 6B-2
656
FIGURE 6C-1
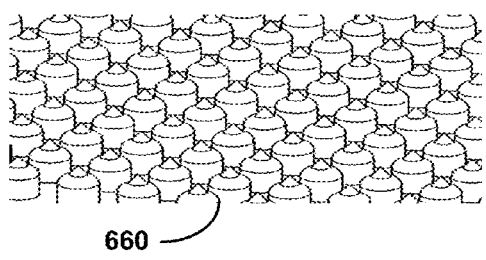
660
FIGURE 6C-2
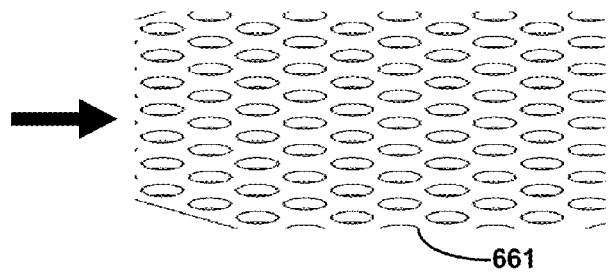
661

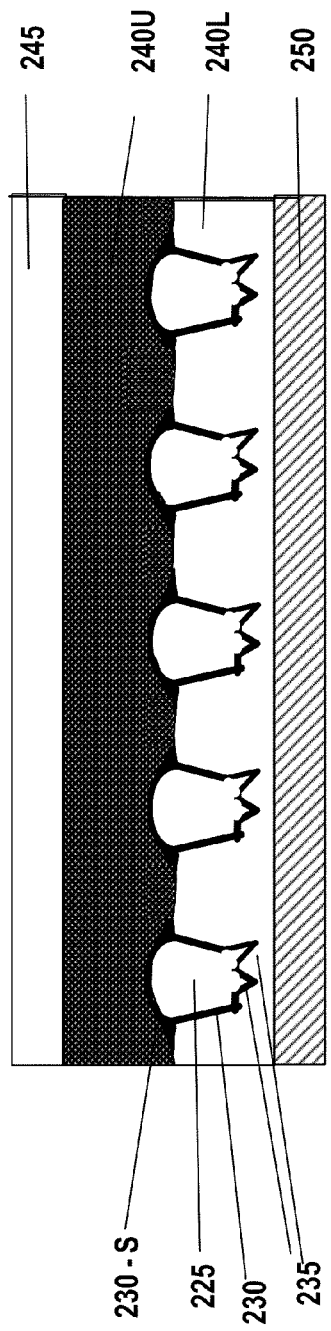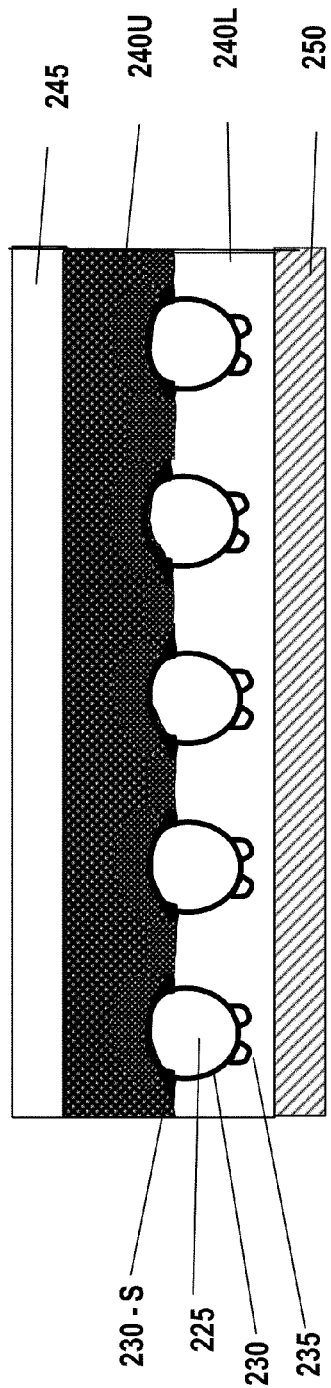

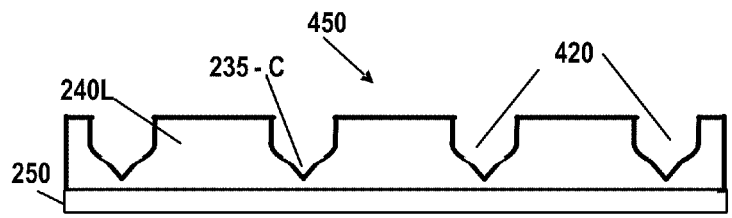
FIG. 10B(1)
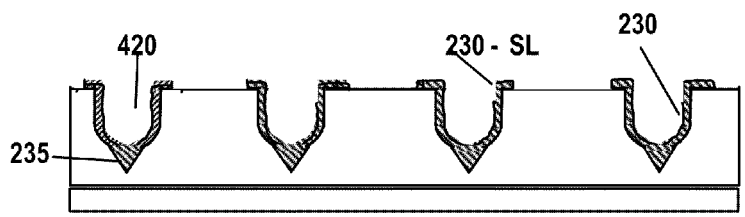
FIG. 10B(2)
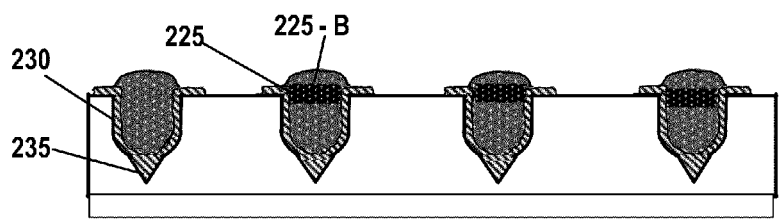
FIG. 10B(3)
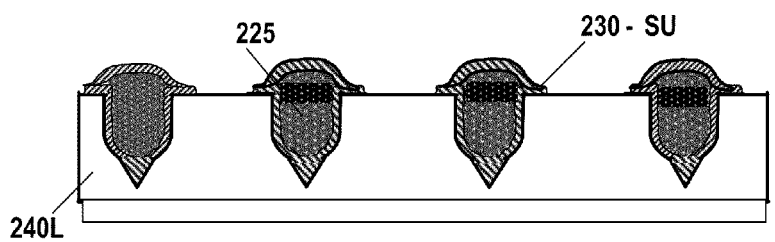
FIG. 10B(4)
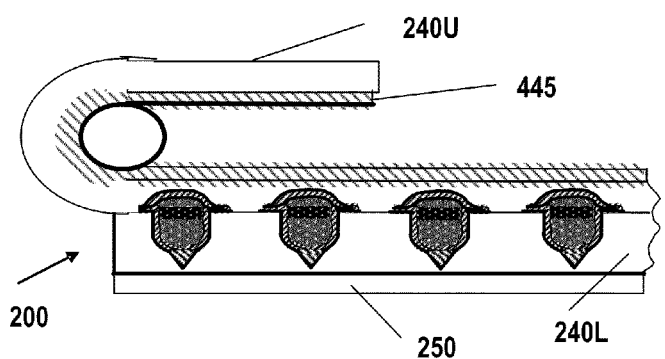
FIG. 10B(5)

NON-RANDOM ARRAY ANISOTROPIC CONDUCTIVE FILM (ACF) AND MANUFACTURING PROCESSES

This Application is a Continuation-in-Part Application of, and claims the benefit of, non-provisional U.S. patent application Ser. No. 11/418,414, filed on May 3, 2006, both of which applications being assigned to the same assignee hereof; this Application also claims the benefit of U.S. Provisional Patent Application No. 60/690,406, which has a priority filing date of Jun. 13, 2005; and this Application hereby incorporates by reference in their respective entirety, the aforementioned non-provisional Patent Application and provisional Patent Application.

BACKGROUND OF THE INVENTION

1. Field of the Invention

This invention relates generally to the structures and manufacturing methods of an anisotropic conductive film (ACF). More particularly, this invention relates to new structures and manufacturing processes of an ACF of improved resolution and reliability of electrical connection at a significantly lower production cost.

2. Description of the Related Art

Current technologies for manufacturing anisotropic conductive films (ACF) or Z-axis conductive adhesive film (ZAF) for interconnecting array of electrodes such as those in liquid crystal display interconnections, chip-on-glass, chip-on-film, flip chip bonding and flexible circuits applications, are still challenged by several major technical difficulties and limitations. For those of ordinary skills in the art, there are still no technical solutions to overcome these difficulties and limitations. The ACF or ZAF comprising conductive particles dispersed in the adhesive film allows electric interconnection in the Z-direction through the thickness of the ACF layer. But horizontally these conductive particles are spaced far enough apart so that the film is electrically insulating in the X-Y directions. ACF comprising electrically conductive particles formed of narrowly dispersed metal-coated plastic particles such as Au/Ni-plated cross-linked polymer beads were taught in, for example, U.S. Pat. Nos. 4,740,657, 6,042,894, 6,352,775, 6,632,532 and J. Applied Polymer Science, 56, 769 (1995). FIG. 1A shows a typical ACF comprising two release films, an adhesive and conductive particles dispersed therein. FIG. 1B shows an exemplary application of an ACF implemented for providing vertical electrical connections between a top and bottom flexible printed circuit (FPC) or chip on film (COF) packages. FIGS. 1C and 1D show the schematic drawings of some typical ACF applications in connecting electrodes and IC chips. To ensure good electric contacts between the electrodes disposed above and below the ACF, conductive particles formed with rigid metallic spikes extended out from the particle surface may be implemented. These rigid metallic spikes improve the reliability of electric connection between electrodes susceptible to corrosion by penetrating through the corrosive film that may be developed over time on the surface of the electrodes.

The first difficulty faced by the conventional technologies is related to the slow and costly processes commonly employed in the preparation and purification of the narrowly dispersed conductive particles commonly implemented as the anisotropic conductive medium. The second difficulty is related to the preparation of ACF for high resolution or fine pitch application. As the pitch size between the electrodes decreases, the total area available for conductive connection in the z-direction by the ACF also decreases. Increasing the concentration of the conductive particles in ACF may increase the total connecting area available for connecting electrodes along the z-direction. However, the increase in the particle concentration may also result in an increase in the conductivity in the x-y direction due to the probability of increase of undesirable particle-particle interaction or aggregation. The degree of aggregation of particles in a dry coating film in general increases dramatically with increasing particle concentration, particularly if the volume concentration of the particles exceeds 15-20%. An improved ACF was disclosed in U.S. Pat. No. 6,671,024 in which a predetermined number of conductive particles were uniformly sprinkled onto an adhesive layer by for examples airflow, static electricity, free falling, spraying, or printing. However, the concentration of the conductive particles that may be used in the processes is still limited by the statistic probability of particle-particle contact or aggregation.

Attempts to reduce the conductivity in the X-Y plane have been disclosed in prior art such as U.S. Pat. No. 5,087,494 (1992), in which a process of making conductive adhesive tape was disclosed by making a predetermined pattern of dimples of a low adhesive surface followed by filling each dimple with a plurality of electrically conductive particles optionally with a binder. An adhesive layer was then applied as an overcoat onto the filled dimples.

In U.S. Pat. No. 5,275,856 (1994), a similar fixed array ACF having an array of perforation was disclosed. Each perforation contains a plurality of electrically conductive particles in contact with an adhesive layer, which is substantially free from electrically conductive material. In either case, the dimple or perforation was filled with, for example, a conductive paste or ink comprising dispersed conductive particles such as silver and nickel particles, and each dimple or perforation contains a plurality of conductive particles. The resultant filled dimples or perforation is relatively rigid and not easy to deform during bonding. Moreover, the filling process often results in an under-filled dimple or perforation due to the presence of solvent or diluent in the paste or ink. A high electrical resistance in the bonding area and a poor environmental and physicomechanical stability of the electric connections are often the issues of this type of ACFs.

In U.S. Pat. Nos. 5,366,140 and 5,486,427, another type of fixed array ACF was disclosed. A thin, low melting metal film on a carrier substrate was cut through the metal layer into a predetermined grid pattern and heated to a temperature higher than the melting point of the metal layer. The metal is beaded up due to the high surface tension of the metal and form an array of metal particles on the substrate. The process relies on a sophisticated balance of surface tension of the metal and the adhesion at the metal/substrate interface. The metal beading process is very susceptible to the presence of impurity or contamination on the surface/interface. The size of the metal bead may be formed by this process is also relatively limited. The shape of the metal bead is also mainly semispherical. A spike on the bead surface is quite difficult to form. Moreover, the metal bead is not easy to deform during bonding and results in a high electrical resistance in the bonding area more often with a poor environmental and physicomechanical stability of the electric connections.

In U.S. Pat. No. 4,606,962, a process of forming ordered array of conductive particles was disclosed. The process includes the steps of rendering areas of an adhesive coating substantially tack-free followed by applying electrically conductive particles only onto the tacky area of the adhesive. In U.S. Pat. No. 5,300,340 (1994) an ACF was prepared by printing an array of conductive particles on a carrier web by for example a negative-working Toray waterless printing plate. In U.S. Pat. No. 5,163,837 an ordered array of connector was prepared by depositing an adhesive into the mesh of an insulating mesh sheet followed by applying discrete electric contacts of a size to fit and fill the mesh. In either the direct or direct printing of conductive particles on a substrate, the size of the printed dots tends to be relatively big and non-uniform and missing particles or aggregation of particles are problems for reliable connections. The resultant ACF is not suitable for fine pitch applications.

U.S. Pat. No. 5,522,962 (1996) taught a method of forming ACF by (1) coating electrically conductive ferromagnetic particles into recesses such as grooves of a carrier web (2) providing a binder, and (3) applying a magnetic field sufficient to align the ferromagnetic particles into continuous magnetic columns, the magnetic columns extending from a recess in the carrier web. The process may allow a better separation of conductive materials by aligning the particles into well separate columns. However, the mechanical integrity, conductivity, and compressibility of metallic columns are still potential problems for reliable connections.

A fixed array ACF was disclosed by K. Ishibashi and J. Kimbura in AMP J. of Tech., Vol. 5, p. 24, 1996. The manufacturing of ACF involves an expensive and tedious process including the steps of photolithographic exposure of resist on a metal substrate, development of photoresist, electroforming, stripping of resist, and finally overcoating of an adhesive. ACF produced piece-by-piece using this batch-wise process could be fine pitch. However, the resultant high cost ACF is not very suitable for practical applications partly because the compressibility or the ability to form conformation contacts with the electrodes and corrosion resistance of the electroformed metallic (Ni) columns are not acceptable and result in a poor electrical contact with the device to be connected to. A similar resin sheet comprising a fixed array of through holes filled with metal substance such as cupper with Ni/Au surface plating on the top surface was taught in U.S. Pat. Nos. 5,136,359 and 5,438,223 and was disclosed as a testing tool by Yamaguchi and Asai in Nitto Giho, Vol. 40, p. 17 (2002). The inability to form conformation contacts with electrodes remains to be an issue. It results in high electrical resistance in the bonding area and a poor long term stability of the electrical connection. Moreover, it's very difficult to form a spike on the top of the electroformed metal columns.

In U.S. Pat. Nos. 6,423,172, 6,402,876, 6,180,226, 5,916,641 and 5,769,996, a non-random array was prepared by coating a curable ferrofluid composition comprising a mixture of conductive particles and ferromagnetic particle under a magnetic field. The ferromagnetic particles are relatively small in size and are washed away later to reveal an array of conductive particles well separated from each other. The processes of using ferromagnetic particles and the subsequent removal of them are costly and the pitch size of the resultant ACF is also limited by the loading of the ferromagnetic particles and conductive particles. Conductive particles with a spike may be used in this prior art to improve the connection to electrodes with a thin corrosion or oxide layer, but the direction of the spike on the particles prepared by this process is randomly oriented. As a result, the effectiveness of the spikes in penetrating into the oxide surface is quite low.

FIG. 1E shows the schematic drawing (not to scale) of a cross sectional view of a non-random array of conductive particles with a more or less random distribution of spike direction prepared according to the methods of U.S. Pat. Nos. 6,423,172, 6,402,876, 6,180,226, 5,916,641 and 5,769,996. The presence of the spike improves the reliability and effectiveness of connection to the electrodes, particularly to electrodes that are susceptive to corrosion or oxidation. However, only the spikes directed toward the electrode surface are effective in penetrating into the oxide layer of the electrode.

Therefore, a need exits in the art to provide an improved configuration and procedure for the manufacturing of ACF, particularly those with improved pitch resolution and connection reliability particularly for those electrodes that are susceptive to oxidation or corrosion.

SUMMARY OF THE PRESENT INVENTION

To facilitate a detailed description of the present invention, we describe herein the numerous innovative aspects of our manufacturing technology to make AFCs implemented with non-random array or arrays of conductive particles.

The first aspect of the present invention is directed to an improved method of making non-random array ACFs by a process comprising the step of fluidic assembling of narrowly dispersed conductive particles into an array of microcavities of a predetermined pattern and well-defined shape and size that allows only one particle to be entrapped in each cavity.

The second aspect of the present invention relates to an improved method of making non-random array ACFs by a process comprising the steps of forming an array of microcavities of predetermined size and shape on a substrate of low adhesion or surface energy, fluidic filling the microcavities with conductive particles having a narrow size distribution which allows only one particle to be contained in each microcavity, overcoating the filled microcavities with an adhesive, and laminating or transferring the particle/adhesive onto a second substrate.

The third aspect of the present invention relates to an improved method of making non-random array ACFs by a process comprising the steps of forming an array of microcavities of predetermined size and shape on a substrate of low adhesion or surface energy, fluidic filling the microcavities with conductive particles having a narrow size distribution which allows only one particle to be contained in each microcavity, followed by transferring the conductive particles onto an adhesive layer.

The fourth aspect of the present invention relates to the use of conductive particles comprising a polymeric core and a metallic shell.

The fifth aspect of the present invention relates to the use of conductive particles comprising a polymeric core, a metallic shell and a metallic spike.

The sixth aspect of the present invention relates to the use of conductive particles comprising a polymeric core and two metallic shells, preferably two interpenetrating metallic shells.

The seventh aspect of the present invention relates to the method of fluidic filling of conductive particles into an array of microcavities in the presence of a field such as magnetic or electric field.

The eighth aspect of the present invention relates to an improved method of making non-random array ACFs by a process comprising the steps of preparing on a substrate an array of microcavities of predetermined shape and size, selectively metalizing the surface of the microcavities, preferably including some top surface area of partition around the skirt of the microcavities, filling the microcavities with a polymeric material and removing or scrapping off the excess of the polymeric material, selectively metalizing the surface of the filled microcavities, preferably including some top surface area of partition around the skirt of the microcavities, and overcoating or laminating the resultant array of filled conductive microcavities with an adhesive optionally with a second substrate.

The ninth aspect of the present invention relates to selective metallization of an array of microcavities by a process comprising printing or coating a plating resist, masking layer, release or plating inhibiting (poison) layer onto preselected areas of the top surface of the partition walls of the microcavities, metalizing the microcavity array, and removing or stripping the metal layers on the plating resist, masking layer, release or plating inhibiting (poison) layer.

The tenth aspect of the present invention relates to an improved method of making non-random array ACFs by a process comprising a step of printing or coating on preselected areas of the top surface of the partition wall of the microcavities with a plating resist, masking layer, release or poison layer comprising a material selected from the list comprising solvent or water soluble polymers or oligomers, waxes, silicones, silanes, fluorinated compounds.

The eleventh aspect of the present invention relates to an improved method of making non-random array ACFs by a process comprising a step of printing or coating on preselected areas of the top surface of the partition wall of the microcavities with a plating resist, masking layer, release or poison layer having a low adhesion to the top surface of the partition walls. The twelfth aspect of the present invention relates to an improved method of making non-random array ACFs by a process comprising a step of printing or coating on preselected areas of the top surface of the partition wall of the microcavities with a masking layer or release layer comprising a high concentration of particulates.

The thirteenth aspect of the present invention relates to an improved method of making non-random array ACFs by a process comprising steps of depositing a conductive coating by sputtering, vapor deposition or electroplating preferably electroless plating on the microcavity array having a plating resist, masking layer, release or poison coating on selected areas of the top surface of partition, followed by stripping or removal of the conductive layer on the top of the plating resist, masking layer, release or poison layer.

The fourteenth aspect of the present invention relates to an improved method of making non-random array ACFs by a process comprising the steps of depositing a conductive coating comprising nano-conductive particles, preferably nano metal particles onto the microcavity array having a masking or release coating on selected areas of the top surface of partition, followed by stripping or removal of the conductive layer on the top of the masking or release layer.

The fifteenth aspect of the invention relates to the preparation of microcavities of well-defined shape, size and aspect ratio.

The sixteenth aspect of the present invention related to an improved method of making non-random array ACFs using an array of microcavities comprising a substructure within the microcavities. The substructure may be in the form of spike, notch, groove, wedge, or nodules to improve the connection to electrodes, particularly to electrodes that are sensitive to corrosion or oxidation.

The seventeenth aspect of the present invention is directed to a non-random array ACF of the present invention comprising a first substrate, a first non-random array conductive particles or filled microcavities, an adhesive, and optionally a second non-random array conductive particles or filled microcavities, and a second substrate.

The eighteenth aspect of the present invention is directed to the use of the non-random array ACF of the invention in applications comprising liquid crystal devices, printed circuit boards, chip on glass (COG), chip on film (COF), tape automatic bonding (TAB), ball grid array (BGA), flip chip or their connection testing tools.

Briefly, in a preferred embodiment, the present invention provides a fine pitch ACF comprising a non-random array of conductive particles or filled microcavities of predetermined size, shape with partition areas to keep the particles or microcavities well separated from each other. The ACFs prepared according to the present invention also provide a better resolution, reliability of electrical connection at a lower manufacturing cost.

In summary, this invention discloses new structures and manufacturing processes of an ACF of improved resolution and reliability of electrical connection using a non-random array of microcavities of predetermined configuration, shape and dimension. The manufacturing process includes the steps of (i) fluidic self-assembly of conductive particles onto a substrate or carrier web comprising a predetermined array of microcavities, or (ii) selective metallization of the array followed by filling the array with a filler material and a second selective metallization on the filled microcavity array. The thus prepared filled conductive microcavity array is then over-coated or laminated with an adhesive film.

These and other objects and advantages of the present invention will no doubt become obvious to those of ordinary skill in the art after having read the following detailed description of the preferred embodiment which is illustrated in the various drawing figures.

BRIEF DESCRIPTION OF THE DRAWINGS

FIGS. 1A to 1D are the schematic drawing of cross sectional views of a typical ACF product and their uses in electrode connection or chip bonding.

FIGS. 2A and 2B are the schematic drawings of the top view and cross section view of a non-random array ACF of the present invention (the conductive particle approach). FIGS. 2C, 2D, 2E and 2F are schematic drawings of other non-random array ACFs of the present invention;

FIGS. 5A, 5B, 5C and 5D show the schematic drawing (not to scale) of the cross-sectional view of other non-random array ACFs of the present invention;

FIGS. 6A-1, 6B-1 and 6C-1 show the schematic 3-D drawings of some typical molds for the preparation of microcavity arrays 6A-2, 6B-2 and 6C-2, respectively; All the molds and the corresponding microcavity arrays are of predetermined and substantially well-defined configuration, shape and size;

FIGS. 8A, 8B and 8C show the schematic drawings (not to scale) of a cross sectional view of an array of filled conductive microcavities comprising substructures such as spikes, nodular, notches, wedges, grooves, etc, all the substructure may be directed substantially downward and manufactured easily by for examples, embossing, stamping, or lithographic methods;

FIG. 10B(1) to 10B(5) are schematic flow charts showing the processing steps of the 8th aspect of the present invention, in which:

FIG. 10B(1) illustrates providing a microcavity array in accordance with the teachings of the present invention;

FIG. 10B(2) illustrates selectively metalizing the surface of the microcavities including some top surface area of partition around the skirt of the microcavities in accordance with the teachings of the present invention;

FIG. 10B(3) illustrates filling the microcavities with a filler preferably polymeric filler and removing or scrapping off the excess of the filler, in accordance with the teachings of the present invention;

FIG. 10B(4) illustrates selectively metalizing the surface of the filled microcavities preferably including some top surface area of partition around the skirt of the microcavities, in accordance with the teachings of the present invention; and FIG. 10B(5) illustrates overcoating or laminating the resultant array of filled conductive microcavities with an adhesive optionally with a second substrate, in accordance with the teachings of the present invention;

DETAILED DESCRIPTION OF THE EMBODIMENTS

Figure 1B:
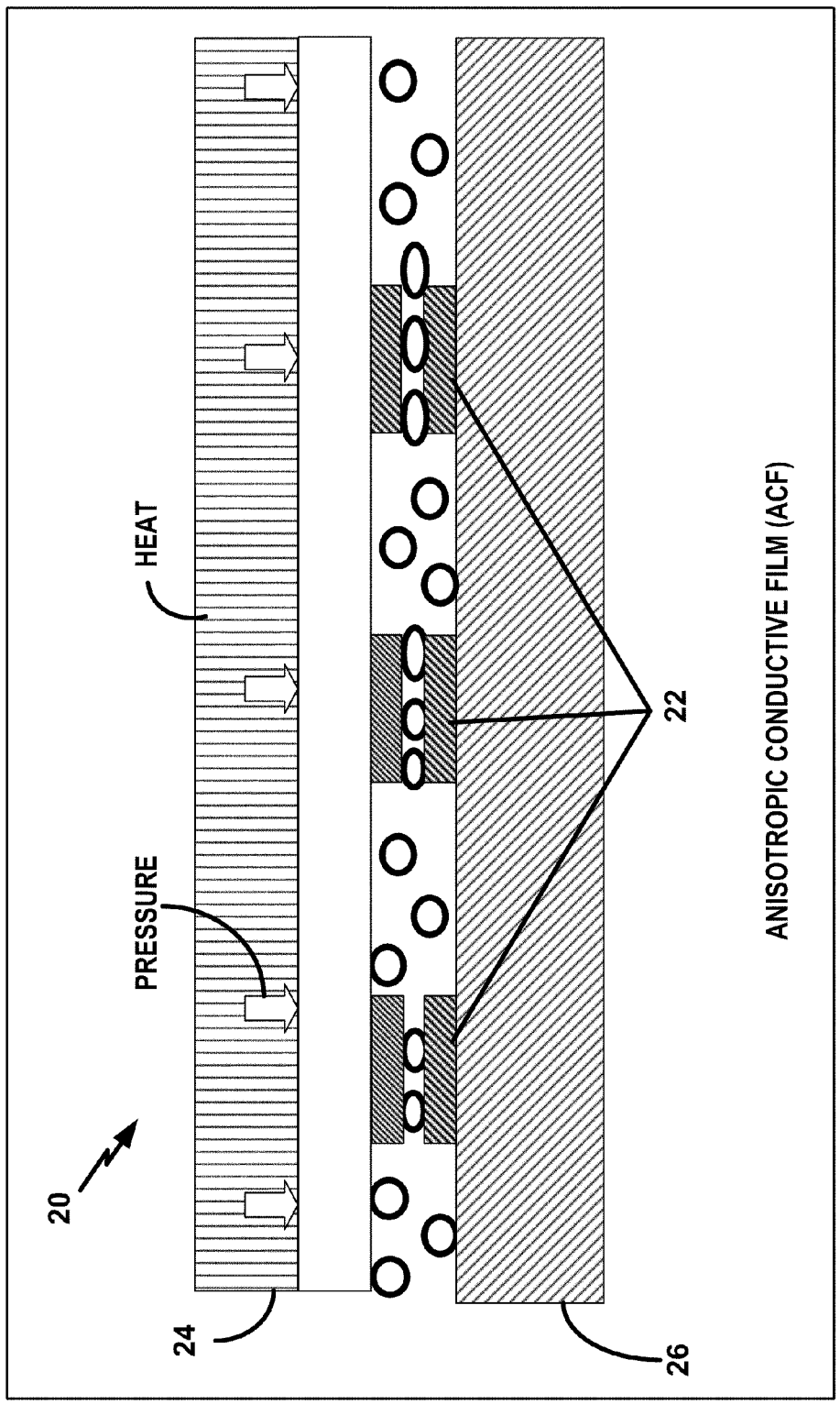
Figure 1C:
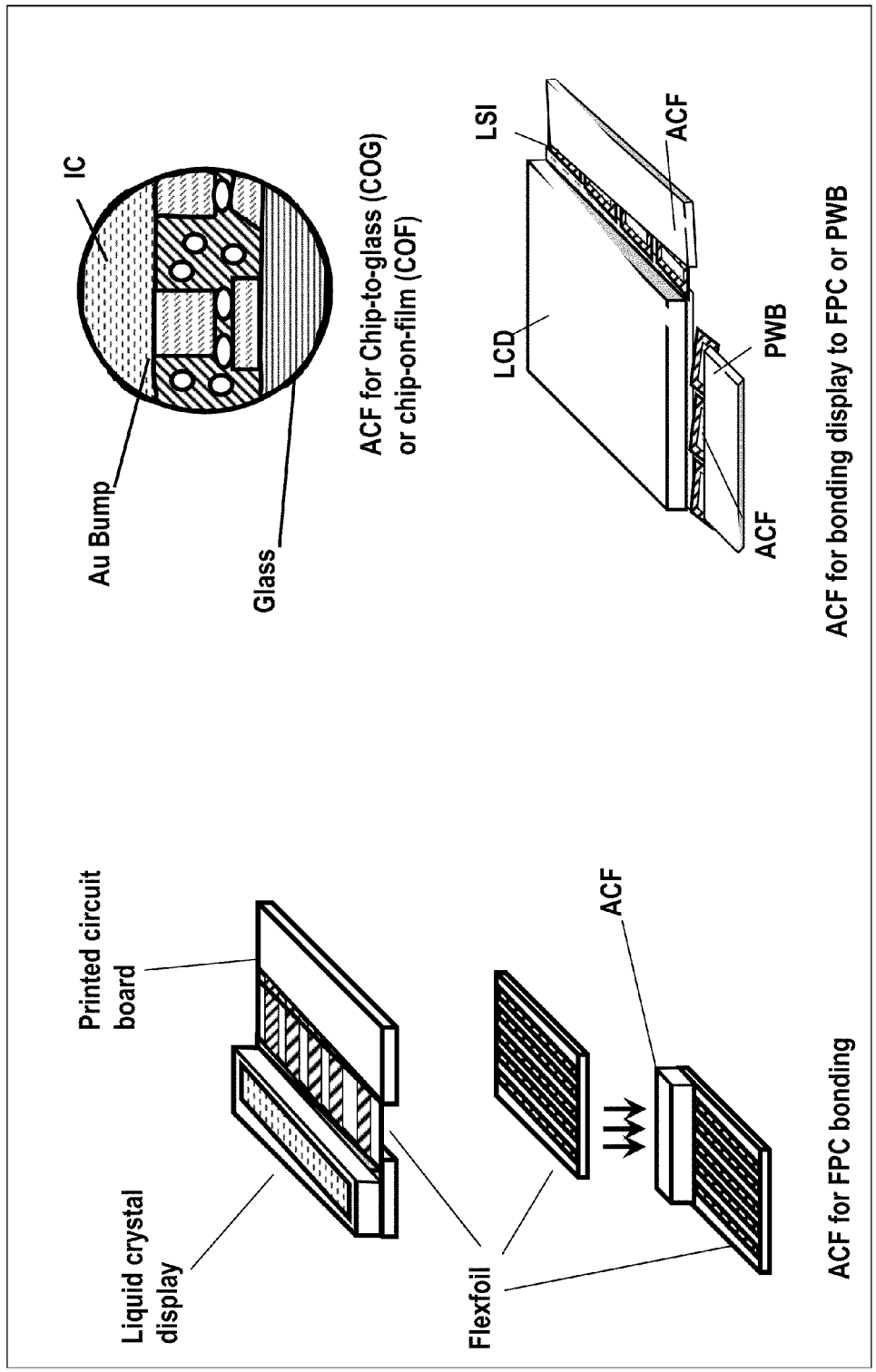
Figure 1D:
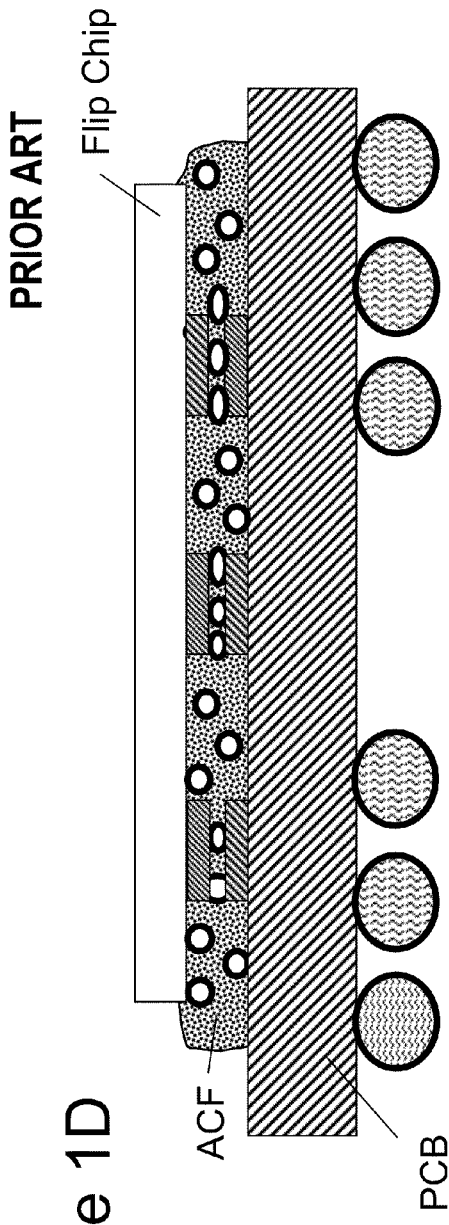
Figure 1E:
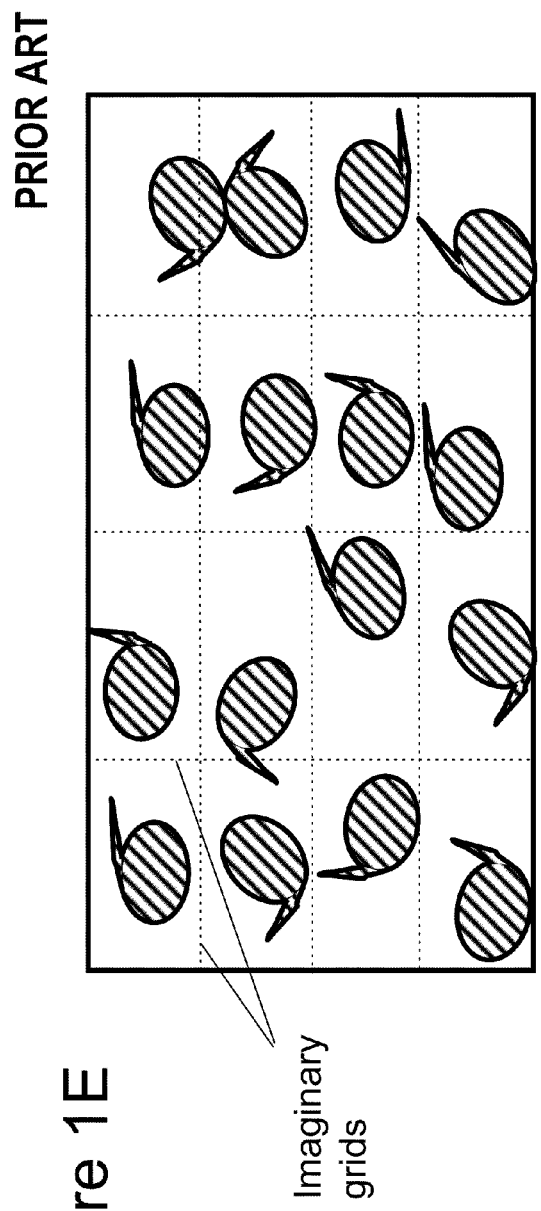
FIG. 1E shows the cross sectional view of a conventional non-random array of conductive particles with a random distribution of spike directions.
Figure 3:
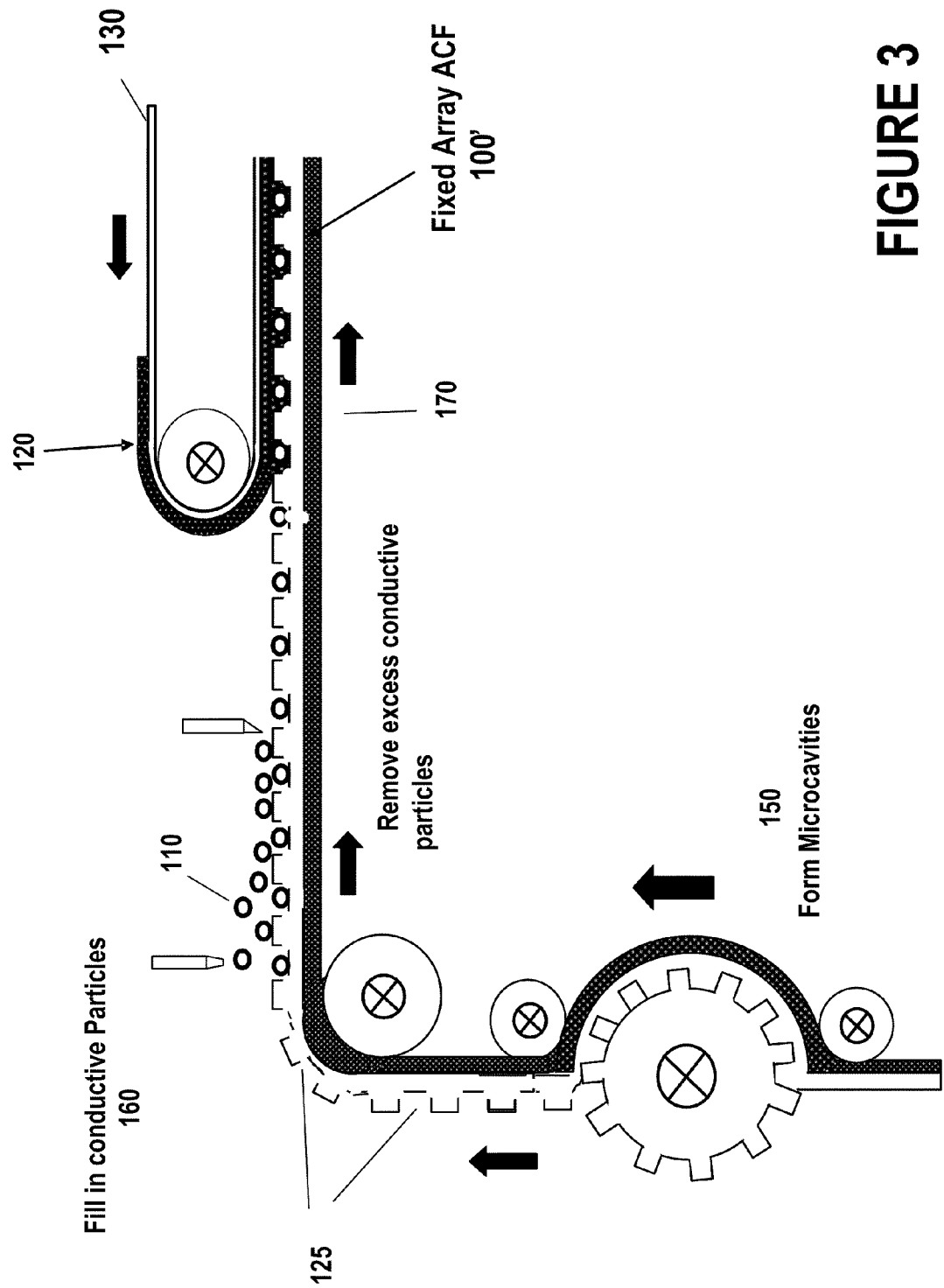
FIG. 3 is the schematic flow chart showing the fluidic assembling of conductive particles into the array of microcavities according to the 2nd aspect of the present invention.
Figure 4:
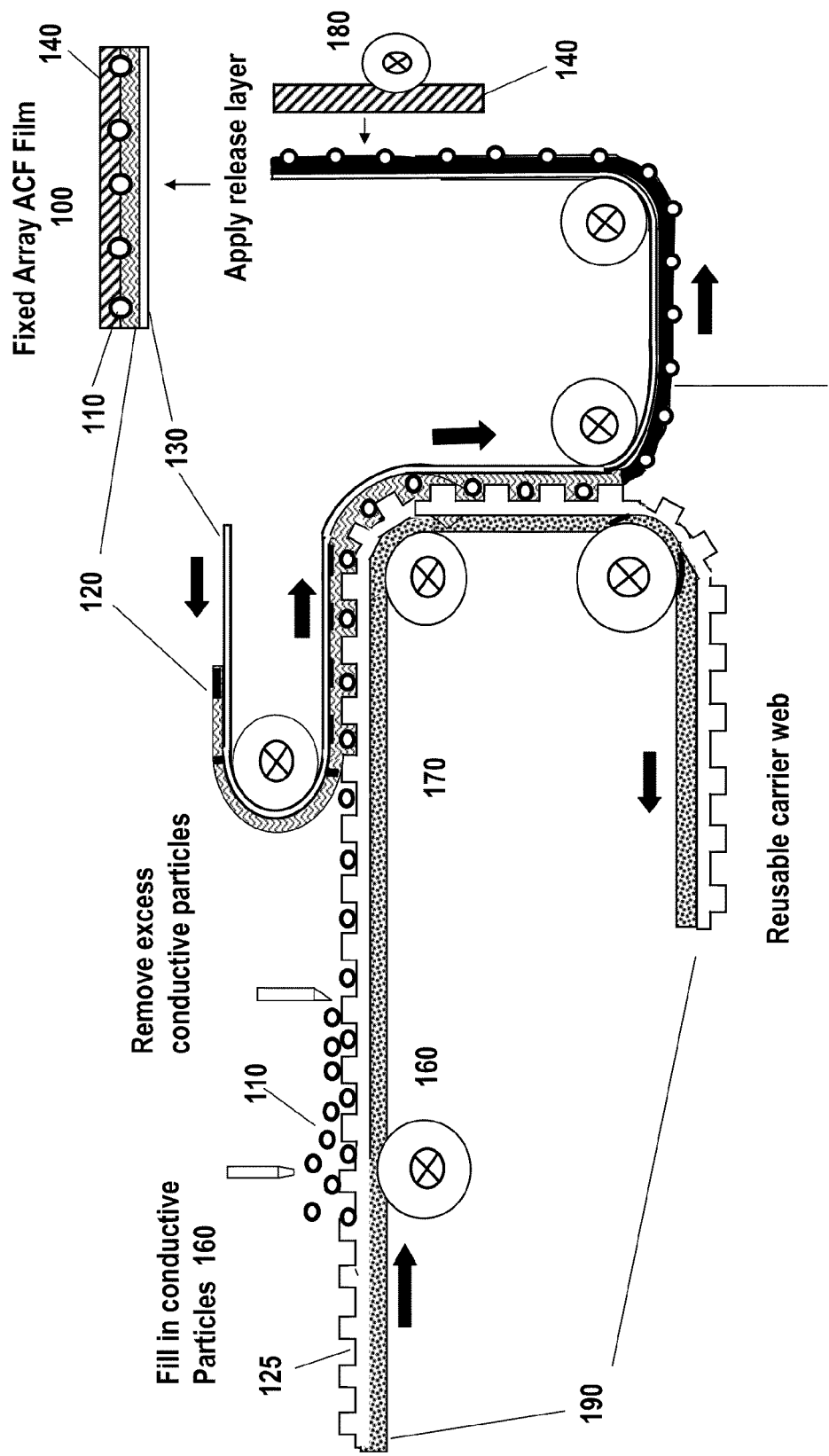
FIG. 4 is the schematic flow charts showing the transferring of the array of fluidic assembled conductive particles to a second web preferably pre-coated with an adhesive layer.

FIGS. 2A to 2F are a top view and side cross sectional views respectively of an ACF (100) as a first embodiment of this invention. FIG. 2A shows the schematic top view of the ACF and FIG. 2B shows the schematic side cross sectional view along a horizontal line a-a' of the top view. The ACF (100) includes a plurality of conductive particles (110) disposed at predetermined locations in an adhesive layer (120) between a bottom (130) and top substrates (140). FIGS. 2C and 2D show two schematic side cross sectional views of an ACF (100') along the horizontal line a-a' shown in FIG. 2A as a second embodiment of this invention. The ACFs (100 and 100') include a plurality of conductive particles (110) disposed in a plurality of microcavities (125) formed between a bottom and top substrates 130 and 140 respectively with the space between the top and bottom substrates filled with adhesive (120). The microcavities (125) may be formed directly on the substrate (130) or on a separate layer (135) above the substrate (130). The depth of the microcavities (125) is preferably larger than the radius of the conductive particles (110), even more preferably larger than the diameter of the conductive particles. The opening of the microcavities is so selected that only one conductive particle (110) can be contained in each microcavity (125). The pitch "p" between the conductive particles can be well defined as the pitch between the microcavities. The processes of fabricating the non-random array or non-random ACFs (100') and (100) are shown in FIG. 3 and FIG. 4, respectively. The pitch "p" between the conductive particles can be predetermined and well defined according to the manufacturing processes described below.

As shown in FIG. 3, a process embodiment of the present invention may start from a process of making a plurality of microcavities (125), for example, by a laser ablation process, by an embossing process, by a stamping process, or by a lithographic process (not shown), at a first stage (150) of a roll-to-roll ACF production station. The microcavity array may be formed directly on the web or on a cavity-forming layer pre-coated on the carrier web. Suitable materials for the web include, but are not limited to polyesters such as polyethylene terephthalate (PET) and polyethylene naphthalate (PEN), polycarbonate, polyamides, polyacrylates, polysulfone, polyethers, polyimides, and liquid crystalline polymers and their blends, composites, laminates or sandwich films. A suitable material for the cavity-forming layer can include, without limitation, a thermoplastic material, a thermoset material or its precursor, a positive or a negative photoresist, or an inorganic material.

Conductive Particle Filling Process:

In a second stage 160, fludic assembling can proceed by depositing a plurality of conductive particles, e.g., conductive particles (110), into the microcavities. Particle deposition may be effected by applying a fluidic particle distribution process and entrapping process, in which each conductive particle (110) is entrapped into one microcavity (125).

There are a number of entrapping processes that can be used. For example a novel roll-to-roll continuous fluidic particle distribution process can be used to entrap only one conductive particle into each microcavity. The entrapped particles then can be transferred from the microcavity array to predefined locations on an adhesive layer. Typically, the distance between these transferred conductive particles must be greater than the distance of percolation threshold, which is the density threshold at which the conductive particles become connected or aggregate. In general, the percolation threshold corresponds to the structure of the microcavity array structure and to the plurality of conductive particles.

Alternatively, a non-contact vibration assisted fluid particle distribution process can be used to carry out the conductive particle entrapping process. The vibration may be generated by a mechanical wave source, an electrical wave source, a magnetic wave source, an acoustic wave source, or an ultrasonic wave source.

To achieve greater than about 90% entrapping yield, a frequency of the vibration source in the range of between about 250 Hz to about 60,000 Hz accommodates a wide range of variation in the relation between the microcavity diameter and the diameter of the particle. It is to noted that for specific relationships between the microcavity opening and the particle size, an effective frequency of the vibration source can be in the range of between about 1 Hz to about 1 million Hz. An example would be a specific case where the relationship is optimum for the frequency of the vibration source in the range of between about 100 Hz to about 100,000 Hz in certain embodiments.

A particle entrapping process also can be achieved by employing a contact push with a seamless felt material, a doctor blade, or a smooth bar, to distribute and place the conductive particles into the microcavity array. Both the non-contact vibration assisted particle entrapping process and the contact push process may be employed, for example, be applied in a sequence to improve the entrapping process to achieve greater than about 90% entrapping yield.

While not exhaustive, these processes are among others that can be applied for entrapping the particles in the microcavities.

In the case when small particles are used, other adjuvant filling processes may include the material flow or turbulence induced by the coating and drying processes, which may be significant for effecting the distribution and entrapping processes, as compared to the gravitational force of the conductive particles. An additional field such as magnetic field or electric field or both may be applied to facilitate the fluidic assembly. The particles may be applied onto the microcavity web by methods including, without limitation a suitable coating, printing, or spraying. Non-limiting examples of a suitable coating process may include a slot coating process, a gravure coating process, a doctor blade coating process, a seamless felt coating process, a bar coating process, or a curtain coating process. A suitable but non-limiting example of a printing process may include an inkjet printing process. Also, a suitable example of spraying process may include, without limitation, a nozzle spraying process.

Excess Conductive Particle Cleaning Process:

It can be desirable to employ one or more processes to remove excess conductive particles, for example, after fluidic assembly. Roll-to-roll continuous fluidic particle distribution processes may include a cleaning process to remove excess conductive particles from the top of microcavity array. A cleaning process may be a non-contact cleaning process, a contact cleaning process, or an effective combination of non-contact and contact cleaning processes.

Certain exemplary embodiments of the particle cleaning process, employ a non-contact cleaning process, including, without limitation, one or more of a suction process, an air blow process, or a solvent spray process. Removed excess conductive particles can be accumulated, for example, by a suction device for recycle or reuse. The non-contact suction process can further be assisted by dispensing a cleaning fluid such as, without limitation, by spraying a solvent or a solvent mixture, to improve the cleaning efficiency.

Certain other exemplary embodiments of the present invention may employ a contact cleaning process was also developed to remove the excess conductive particles from the top of microcavity array. The contact cleaning process includes the use of a seamless felt, a wiper, a doctor blade, an adhesive material, or a tacky roll. When a seamless felt is applied, a suction process also may be used to recycle conductive particles from the seamless felt surface and to refresh the felt surface. In this felt/suction process, both capillary force and suction force draw the excess conductive particles with suction force applied from inside of seamless felt to remove and recycle the excess particles. This suction process can be further assisted by dispensing a cleaning fluid, a solvent, or a solvent mixture to improve the cleaning efficiency. Typically, removal of excess conductive particles is performed at the end of the second stage (160).

After a particle cleaning process, a particle deposition step may be repeated to assure no particles are missing from the microcavities. In a third stage (170), the conductive particles (110) deposited in the microcavities are laminated to a second substrate (130) precoated with an adhesive layer (120) in the lamination station (180) as shown in FIG. 4, to form a non-random array ACF (100). FIGS. 2C and 2D show two schematic ACFs prepared according to the process of FIG. 3 wherein particles (110) and microcavities (125) having various ratios of the particle diameter to the depth of the microcavity may be used. Alternatively, an adhesive may be coated directly onto the filled microcavities, optionally followed by a lamination onto the second substrate (130).

FIG. 4 shows a schematic flow of the ACF manufacturing process using a temporary carrier web (190) comprising an array of microcavities. The microcavity array may be formed directly on the temporary carrier web or on a cavity-forming layer pre-coated on the carrier web. Suitable materials for the carrier web include, but are not limited to polyesters such as polyethylene terephthalate (PET) and polyethylene naphthalate (PEN), polycarbonates, polyamides, polyacrylates, polysulfones, polyethers, polyimides, polyamides, liquid crystalline polymers and their blends, composites, laminates, sandwich or metalized films. Suitable materials for the cavity-forming layer may be selected from a list comprising thermoplastics, thermosets or their precursors, positive or negative photoresists, inorganic or metallic materials.

To achieve a high yield of particle transfer, the carrier web is preferably treated with a thin layer of release material to reduce the adhesion between the microcavity carrier web (190) and the adhesive layer (120). The release layer may be applied by coating, printing, spraying, vapor deposition, thermal transfer, or plasma polymerization/crosslinking either before or after the microcavity-forming step. Suitable materials for the release layer include, but are not limited to, fluoropolymers or oligomers, silicone oil, fluorosilicones, polyolefines, waxes, poly(ethyleneoxide), poly(propyleneoxide), surfactants with a long-chain hydrophobic block or branch, or their copolymers or blends.

After the fluidic filling step (160), the conductive particles in the microcavities may be transferred to the second substrate (130), which is preferably pre-coated with an adhesive (120) as shown in FIG. 4. The temporary microcavity web (190) may then be reused by repeating the particle filling and transferring steps. Optionally, the web (190) may be cleaned by a cleaning device (not shown) to remove any residual particles or adhesive left on the web and a release coating may be reapplied before refill the particles. Still optionally, a close loop of temporary microcavity web may be used continuously and repeatedly for the particle filling, transferring, cleaning and release application steps.

Conductive Particle Transfer Process:

After the conductive particles are entrapped in the microcavity array, they are transferred from the microcavity array to the adhesive layer. To achieve greater than 90% transfer yield, the following conditions were found to be critical:

The cohesion strength of the adhesive layer must be no less than the adhesion strength between the adhesive layer and microcavity array; the adhesion strength between the adhesive layer and microcavity array must be less than the adhesion strength between the adhesive layer and the substrate (release liner) that carries the adhesive layer. The adhesion strength of the microcavity array film and the release liner is controlled by release coating or corona treatment.

The peeling angle between the microcavity film and the adhesive layer is in the range of between about more than 0 degrees of peeling angle to about 135 degrees of peeling angle, relative to the film surface. In some selected embodiments, it may be preferred that the peeling angle be in the range of about 30 degrees of peeling angle to about 90 degrees of peeling angle. Also, it is desirable that during the particle transfer process, the surface temperature of the adhesive layer be in the range of between about 0° C. to about 90° C. In certain selected embodiments it may be preferred that the surface temperature of the adhesive layer be in the range of between about 15° C. to about 60° C. Additionally, it can be desirable to maintain the pressure of the particle transfer process in the range of between 0.1 megapascals to 100 about megapascals. Furthermore, it can be desirable that the adhesive layer have a Young's modulus in the range of between about 0.01 megapascals to about 100 megapascals. In some embodiments, it may be preferred to have the Young's modulus of the adhesive layer be in the range of between about 0.1 megapascals to about 10 megapascals.

The modulus distribution of the adhesive also can be critical for successful transfer. The adhesive modulus may be adjusted by adjusting the amount of residual solvent in adhesive and/or by adjusting the transfer temperature. For example, a desirable modulus can be obtained for a transfer temperature of up to about 40° C. that can apply to a number of cases. Changing the composition and amount of the residual solvent can affect the range of the transfer temperature and in some cases can bring the transfer temperature to room temperature.

An adhesive layer exhibits modulus gradients across adhesive thickness with a higher modulus on the release liner side and lower modulus on the adhesive side. The modulus gradient can be achieved by introducing a trace amount of solvent from conductive particle distribution process, by adjusting the temperature gradient introduced during transfer process, or by both. A temperature gradient may be achieved by applying a surface heating source, by using a heat sink from the release liner, or both. The surface heating source can be, without limitation, a heated roll source, an infrared source, a hot air source, or a wire source. Suitable combinations of these exemplary sources also may be desirable.

Typically the adhesive layer is disposed on a substrate such as polyethylene terephthalate (PET) and polyethylene naphthalate (PEN), polycarbonate, polyamides, polyacrylates, polysulfone, polyethers, polyimides, and liquid crystalline polymers film. After the conductive particles are transferred, the film is slit and wound into reels. The backside of the substrate then contacts the top surface of the adhesive. In this scenario, the following condition must be met to have proper release:

The adhesion strength between the adhesive layer and the front side or back side of the substrate must be weaker than the cohesion strength of the adhesive layer.

The adhesion strength between the adhesive layer and the front side of the substrate must be stronger than the adhesion strength between the adhesive layer and the back side of the substrate.

The adhesion strength between the adhesive layer and the front side of the substrate must be weaker than the adhesion strength between the adhesive layer and the bonding substrate, such as print circuit board, flexible print circuit board, polymer film, glass, etc., to be able to release the substrate after the pre-bonding process of ACF bonding application.

A non-limiting exemplary embodiment of a novel conductive particle transfer process can employ a differential shear process between the adhesive layer and the microcavity array. The differential shear is achieved by web speed differentiation between the adhesive coated release liner and the microcavity array. The web speed of release liner can be slightly higher or lower than that of the microcavity array.

After the conductive particles are transferred to the adhesive layer, the particles can be partially embedded in the adhesive layer. These partially embedded conductive particles can improve the ACF bonding performance with higher adhesion strength, reduced voids, and lower contact resistance. Optionally, after the conductive particles are transferred to the adhesive layer, the adhesive layer may further be treated to have a modulus gradient and a viscosity gradient built across the adhesive layer, with the side of adhesive surface bearing the conductive particles possessing a higher modulus and a higher viscosity. This higher modulus and higher viscosity can help to maintain the conductive particles at their non-random array location during ACF bonding applications. The viscosity gradient across adhesive layer can be achieved by applying a heating process, including, without limitation, surface radiation, infrared radiation, UV radiation, a or a heated roll heating process. Suitable combinations of these heating processes also can be efficacious.

Optionally a second substrate can be applied on the top side of the adhesive layer for protection and improved release property of the adhesive. In this scenario, the following condition must be met to have proper release:

The adhesion strength between the adhesive layer and the first substrate or the second substrate must be weaker than the cohesion strength of the adhesive layer.

The adhesion strength between the adhesive layer and the first substrate must be stronger than the adhesion strength between the adhesive layer and the second substrate.

The adhesion strength between the adhesive layer and the first substrate must be weaker than the adhesion strength between the adhesive layer and the bonding substrate, such as print circuit board, flexible print circuit board, polymer film, glass, etc., to be able to release the substrate after the pre-bonding process of ACF bonding application.

The resultant film (100") may be used directly as a non-random array ACF as shown in the schematic FIGS. 2E (top view) and 2F (cross-section view) wherein the conductive particles (110) are on the top of the adhesive film (120) and may not be covered completely by the adhesive. Optionally, an additional thin layer of adhesive layer may be over-coated onto the as-transferred particle layer to improve the tackiness of the non-random array ACF film, particularly when the particle concentration is high. An adhesive different from that for the adhesive film (120) may be employed for the over-coating.

The film (100") may further be laminated at the lamination station (180) with a third substrate (140) which is optionally precoated with an adhesive, to result in a non-random array ACF (100) sandwiched between two substrates (130 and 140) as shown in FIG. 2B. The adhesion strengths between the adhesive (120) and the two substrates (130 and 140) should be lower than the cohesion strength of the adhesive. To facilitate the sequential peeling of the two substrates from the adhesive during bonding, it is preferable that one of the adhesion strengths is substantially larger than the other.

The adhesives used in the above-mentioned processes may be thermoplastic, thermoset, or their precursors. Useful adhesives include but are limited to pressure sensitive adhesives, hot melt adhesives, heat or radiation curable adhesives. The adhesives may comprise for examples, epoxide, phenolic resin, amine-formaldehyde resin, polybenzoxazine, polyurethane, cyanate esters, acrylics, acrylates, methacrylates, vinyl polymers, rubbers such as poly (styrene-co-butadiene) and their block copolymers, polyolefins, polyesters, unsaturated polyesters, vinyl esters, polycaprolactone, polyethers, and polyamides. Epoxide, cyanate esters and multifunctional acrylates are particularly useful. Catalysts or curing agents including latent curing agents may be used to control the curing kinetics of the adhesive. Useful curing agents for epoxy resins include, but are not limited to, dicyanodiamide (DICY), adipic dihydrazide, 2-methylimidazole and its encapsulated products such as Novacure HX dispersions in liquid bisphenol A epoxy from Asahi Chemical Industry, amines such as ethylene diamine, diethylene triamine, triethylene tetraamine, BF3 amine adduct, Amicure from Ajinomoto Co., Inc, sulfonium salts such as diaminodiphenylsulphone, p-hydroxyphenyl benzyl methyl sulphonium hexafluoroantimonate. Coupling agents including, but are not limited to, titanate, zirconate and silane coupling agents such as glycidoxypropyl trimethoxysilane and 3-aminopropyl trimethoxy-silane may also be used to improve the durability of the ACF. The effect of curing agents and coupling agents on the performance of epoxy-based ACFs can be found in S. Asai, et al, J. Appl. Polym. Sci., 56, 769 (1995). The entire paper is hereby incorporated by reference in its entirety.

Suitable conductive particles for the present invention are of a narrow particle size distribution with a standard deviation of less than about 10%, preferably, less than about 5%, even more preferably less than about 3%. The particle size is preferably in the range of about 1 um to about 250 um, more preferably about 2 um to about 50 um, even more preferably about 2 um to about-6 um. The size of the microcavities and the conductive particles are selected so that each microcavity has a limited space to contain only one conductive particle. To facilitate particle filling and transferring, a microcavity having a tilted wall with a wider top opening than the bottom may be employed.

Conductive particles comprising a polymeric core and a metallic shell are particularly preferred. Useful polymeric cores include but are not limited to, polystyrene, polyacrylates, polymethacrylates, polyvinyls, epoxy resins, polyurethanes, polyamides, phenolics, polydienes, polyolefins, aminoplastics such as melamine formaldehyde, urea formaldehyde, benzoguanamine formaldehyde and their oligomers, copolymers, blends or composites. If a composite material is used as the core, nano particles or nano tubes of carbon, silica, alumina, BN, $TiO_2$ and clay are preferred as the filler in the core. Suitable materials for the metallic shell include, but are not limited to, Au, Pt, Ag, Cu, Fe, Ni, Sn, Al, Mg and their alloys. Conductive particles having interpenetrating metal shells such as Ni/Au, Ag/Au, or Ni/Ag/Au are particularly useful for optimum hardness, conductivity and corrosion resistance. Particles having rigid spikes such as Ni, carbon, graphite are useful in improving the reliability in connecting electrodes susceptible to corrosion by penetrating into the corrosive film if present.

The narrowly dispersed polymer particles useful for the present invention may be prepared by for examples, seed emulsion polymerization as taught in U.S. Pat. Nos. 4,247, 234, 4,877,761, 5,216,065 and Ugelstad swollen particle process as described in Adv., Colloid Interface Sci., 13, 101 (1980); J. Polym. Sci., 72, 225 (1985) and "Future Directions in Polymer Colloids", ed. El-Aasser and Fitch, p. 355 (1987), Martinus Nijhoff Publisher. In one preferred embodiment of the present invention, monodispersed polystyrene latex particle of about 5 um diameter is used as the deformable elastic core. The particle is first treated in methanol under mild agitation to remove excess surfactant and to create microporous surfaces on the polystyrene latex particles. The thus treated particles are then activated in a solution comprising $PdCl2$, HCl and $SnCl2$ followed by washing and filtration with water to remove the $Sn4^+$ and then immersed in an electroless Ni plating solution (from for example, Surface Technology Inc, Trenton, N.J.) comprising a Ni complex and hydrophosphite at about 90° C. for about 30 minutes to about 50 minutes. The thickness of the Ni plating is controlled by the plating solution concentration and the plating conditions (temperature and time).

The Ni coated latex particle is then placed in an immersion Au plating solution (for example from Enthone Inc.) comprising hydrogen tetrachloroaurate and ethanol at about 90° C. for about 10 minutes to about 30 minutes to form interpenetrating Au/Ni shells having a total metal (Ni+Au) thickness of about 1 um. The Au/Ni plated latex particles are washed with water and ready for the fluidic filling process. Processes for coating conductive shell on particles by electroless and/or electroplating were taught in for examples, U.S. Pat. No. 6,906,427 (2005), U.S. Pat. No. 6,770,369 (2004), U.S. Pat. No. 5,882,802 (1999), U.S. Pat. No. 4,740,657 (1988), US Patent Application 20060054867, and Chem. Mater., 11, 2389-2399 (1999).

Fluidic assembly of IC chips or solder balls into recess areas or holes of a substrate or web of a display material has been disclosed in for examples, U.S. Pat. Nos. 6,274,508, 6,281,038, 6,555,408, 6,566,744 and 6,683,663. Filling and top-sealing of electrophoretic or liquid crystal fluids into the microcups of an embossed web were disclosed in for examples, U.S. Pat. Nos. 6,672,921, 6,751,008, 6,784,953, 6,788,452, and 6,833,943. Preparation of abrasive articles having precise spacing by filling into the recesses of an embossed carrier web, an abrasive composite slurry comprising a plurality of abrasive particles dispersed in a hardenable binder precursor was also disclosed in for examples, U.S. Pat. Nos. 5,437,754, 5,820,450 and 5,219,462. All of the aforementioned United States Patents are hereby incorporated by reference in their respective entirety. In all the above-mentioned art, recesses, holes, or microcups were formed on a substrate by for example, embossing, stamping, or lithographic processes. A variety of materials were then filling into the recesses or holes for various applications including active matrix thin film transistors (AM TFT), ball grid arrays (BGA), electrophoretic and liquid crystal displays. However, none of the prior art disclosed the preparation of ACFs by fluidic filling of only one conductive particle in each microcavity or recess. Also, none of the prior art taught the fluidic self assembly of conductive particles comprising a polymeric core and a metallic shell.

Refer to FIGS. 5A to 5D for several ACF configurations as alternate preferred embodiments of this invention. Instead of conductive particles as that commonly implemented in the conventional ACF and as that shown in FIGS. 2A-2F, the ACF (200) provides the z-direction electric conductivity by a plurality of microcavities (220) filled with a polymeric core (225) and surrounded by a metallic shell (230). As shown in FIG. 5A, the microcavities are disposed in adhesive layers (240U and 240L) supported between a top (245) and a bottom (250) substrate. The two adhesive layers (240U and 240L) may be of the same composition. The microcavities may be formed by for example, laser ablation, stamping, embossing, or lithography and the metallic shell (230) is deposited thereon. When an embossing process is employed, tilted walls are preferable to vertical walls for more convenient mold release. In FIG. 5B, the metallic shell (230) has a skirt edge (230-S) covering the top and extending out from the top edge of the sidewalls of the metallic shell. In FIG. 5C and FIG. 5D, the microcavities further include a bottom spike 235 extending from a bottom surface of the metallic shell. In FIG. 5D, the microcavities are covered with a metallic shell having a skirt edge extension on the top surface and metallic spikes extended from the bottom surface.

FIGS. 6A to 6D are some examples of molds and microcavity arrays of different shapes and dimensions arranged in different kinds of configurations. The microcavities may be formed directly on a plastic web substrate with, or without, an additional cavity-forming layer. Alternatively, the microcavities may also be formed without an embossing mold, for example, by laser ablation or by a lithographic process using a photoresist, followed by development, and optionally, an etching or electroforming step. Suitable materials for the cavity forming layer can include, without limitation, a thermoplastic, a thermoset or its precursor, a positive or a negative photoresist, or an inorganic or a metallic material. As to laser ablating, one embodiment generates a laser beam for ablation having power in the range of between about 0.1 W/cm$^2$ to about 200 W/cm$^2$ employing a pulsing frequency being between about 0.1 Hz to about 500 Hz; and applying between about 1 pulse to about 100 pulses. In a preferred embodiment, laser ablation power is in the range of between about 1 W/cm$^2$ to about 100 W/cm$^2$, employing a pulsing frequency of between about 1 Hz to about 100 Hz, and using between about 10 pulses to about 50 pulses. It also is desirable to apply a carrier gas with vacuum, to remove debris.

FIGS. 6A-1, 6B-1 and 6C-1 are the 3D schematic drawings of three different embossing molds, 650, 655, 660, respectively, and FIGS. 6A-2, 6B-2, and 6C-2, are the corresponding three arrays of microcavities, 651, 656, 661, respectively, formed by applying the molds.

Figure 6D:
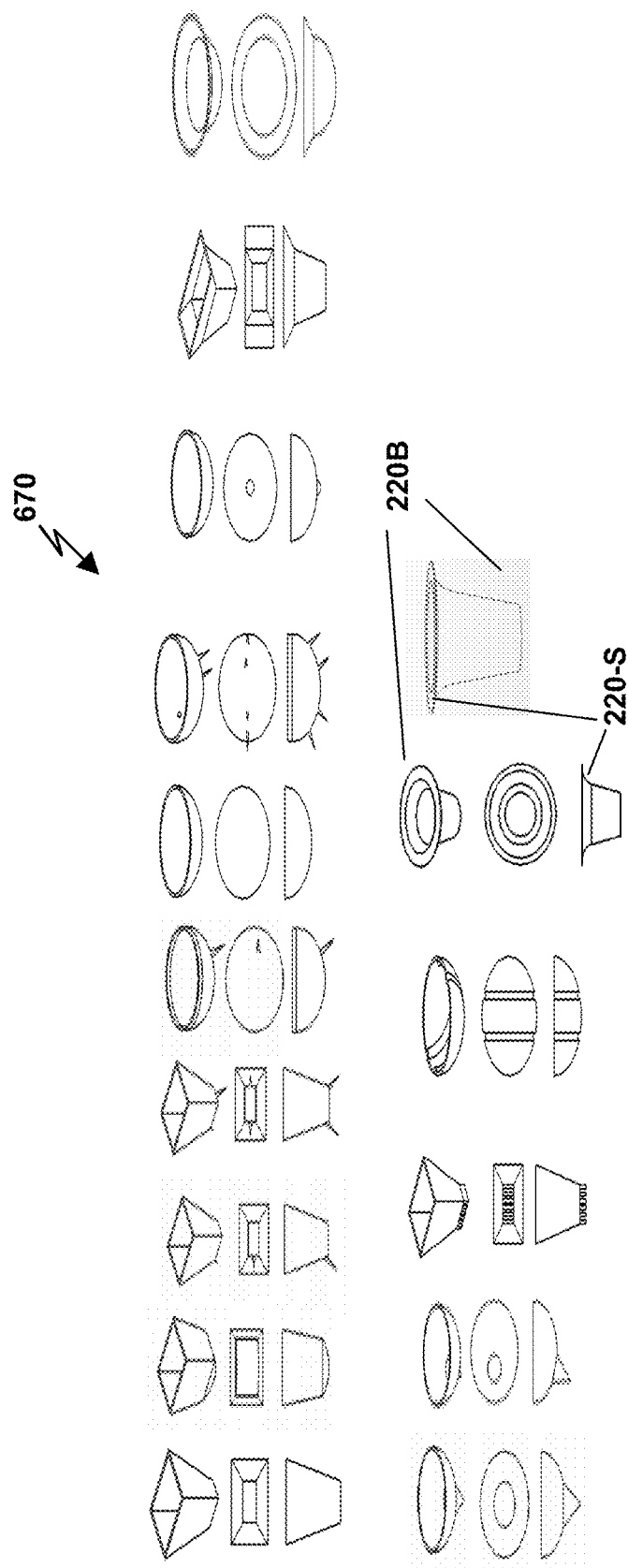
FIG. 6D shows the schematic drawing (not to scale) of several microcavities having various shapes (semispherical, square, rectangular, hexagonal, column . . . etc) and substructures (spikes, nodules, notches, wedges, grooves, etc.)

FIG. 6D shows a variety of examples of microcavities generally at 670 having different configurations and different types of metallic spikes extended from the bottom surface of the microcavities. The skirt edge extension (230-S) improves the electric connection between the top metallic shell (220T) and the bottom metallic shell (220B). To further assure the electric connection, the microcavities may also be formed with a curved edge (220-S).

Figure 6E:
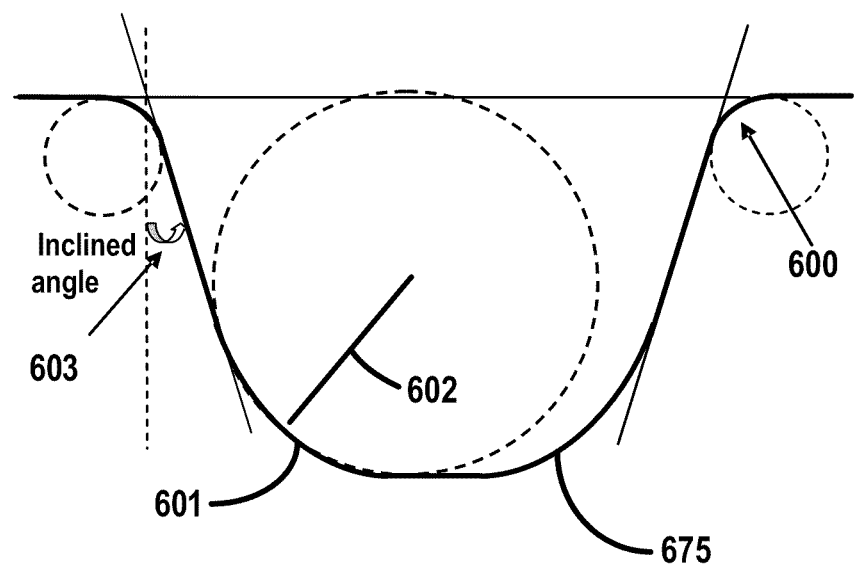
FIG. 6E shows a cross-sectional view of a micro cavity as found in the examples as in FIG. 6C-2 and 6D.

FIG. 6E identifies the cross-sectional view of a bowl shaped microcavity 675 as one of the embodiments shown previously. Inherent to this design is the importance of the inclined angle 603 (need to label on the drawing) in regards to the shape of the wall of the cavity and in particular the bottom surface 601 and the top opening 600. Further, of importance is the relationship between the radius of the bottom surface 602 to the radius of the conductive particle. An optimum range for the bottom surface is to have a radius of between about 0.2 to about 5.0 times the radius of a conductive particle. More particularly, is the bottom surface to have a radius of between about 0.8 to about 2.0 times the radius of a conductive particle.

Figure 6G:
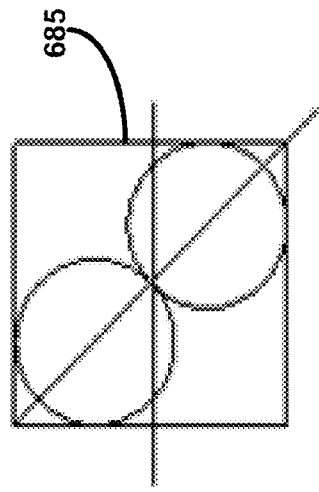
FIG. 6G is a top view of a square shape microcavity as previously shown.
Figure 6I:
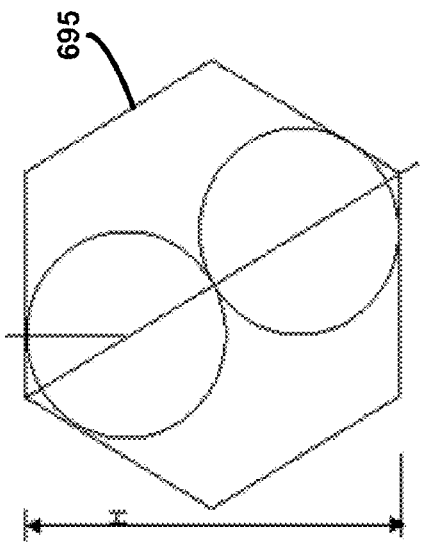
FIG. 6I is a top view of a hexagonal shape cavity as previously shown in accordance with the teachings of the invention embodied herein.
Figure 6F:
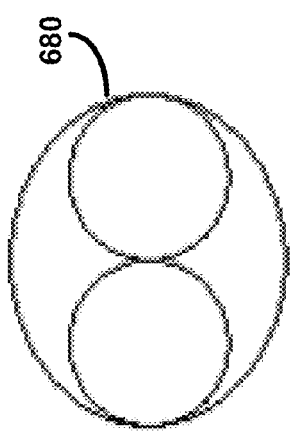
FIG. 6F is a top view of an ellipse shape as previously shown in FIG. 6D.

FIG. 6F is a top view of a previously identified embodiment for an ellipse shape for a microcavity 680. In application, a desirable ration is where the minor diameter is less than about 1.732 times the diameter of the conductive particle and a major diameter less than about 2 times of the diameter of the conductive particle. More particularly, in application it is desirable to have the minor and major diameter of the ellipse opening to have a standard deviation of less than about 10% of the mean. This standard deviation is believed to be a critical element due to the size of the particles, and the dynamics of the system for inserting the particles into the microcavities.

Turning now to FIG. 6G there is a top view of a square shape of the microcavity opening 685. In application, each side is less than about 1.707 times the diameter of the conductive particle. It is a critical factor that the square opening has a standard deviation of less than about 10% of the mean.

Figure 6H:
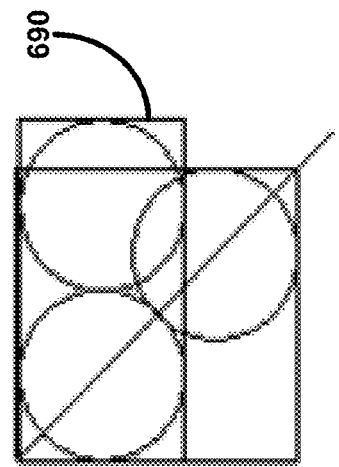
FIG. 6H is a top view of a rectangular shape microcavity in accordance with the teachings of the invention embodied herein.

Focusing now on FIG. 6H, the top of a rectangular shaped microcavity 690 is identified. It is desirable to have the mean width of the opening of microcavity 690 less than about 1.7 times that of the diameter of a conductive particle. Further, that the sum of L and W should be less than about 3.4 times the diameter of the conductive particle, and preferably less than about 3 times the diameter. It is found that the optimum length and width of the rectangular opening have a standard deviation of less than about 10% of the mean.

FIG. 6I illustrates a substantially hexagonal-shaped top opening of a microcavity 695, as shown earlier in the figures. It is desirable to have a height less than about 1.86 times the diameter of a conductive particle and the height should have a standard deviation of less than about 10% of the mean particle diameter.

Figure 6J:
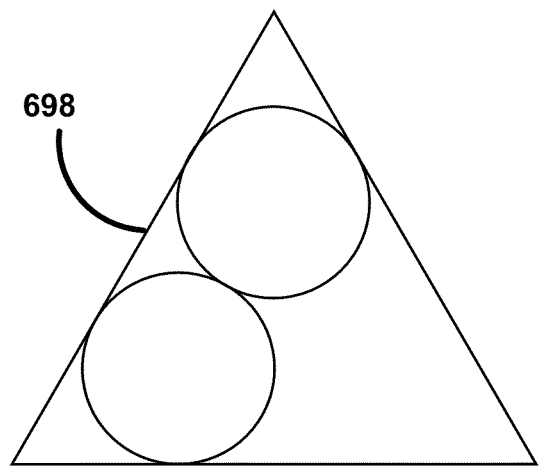
FIG. 6J is a top view of an equilateral triangle shape cavity in accordance with the teachings of the invention embodied herein.

FIG. 6J illustrates a substantially equilateral triangle-shaped top opening of a microcavity 695 with a side width less than about $\sqrt{3}+1$ times of the diameter of a conductive particle. It is desirable to have an opening having a standard deviation less than about 10% of the mean.

To maintain uniform contact and thus constant contact resistance on each electrode bonding, which is required for high speed circuit, conductive particles must embed uniformly, according to designed fixed array pattern, in ACF. This requires high transfer efficiency of the cavities, and high transfer rate of the conductive particles from cavity to the adhesive layer. To achieve high transfer efficiency, the diameter of the conductive particles and the diameter of the cavities must have specific tolerance. To achieve high transfer rate, the diameter of the cavities must have specific tolerance Less than about 5% to about 10% standard deviation requirement is based on the following rationales:

a. Less than about 10% is optimal to have a high filling and transfer efficiency.

b. Between about 10% to about 20% might yield slightly lower efficiency but is acceptable from application point of view.

c. Less than about 5% is technically hard to achieve within reasonable costs.

d. Higher than about 20%, the possibility of more than one particle per cavity would increase.

The incline angle also affects the filling and transfer efficiency. It is easier to fill in the particle when the incline angle is large but it also makes the particle to come out the cavity easily before the transfer. Between about 0 degrees to about 30 degrees is an optimal incline angle. Between about 30 degrees to about 60 degrees angle of incline also may yield acceptable results in certain applications.

The depth of the cavity also is critical in the processes of filling and of transferring conductive particles. With a deep cavity, it's easier to keep the particle in the cavity before transfer to the epoxy layer; however, it's more difficult to transfer the particles. With a shallow cavity, it's easier to transfer the particle to the adhesive layer; however, it's more difficult to keep the particles that are filled in the cavity before the transfer of the particles.

Figure 6K:
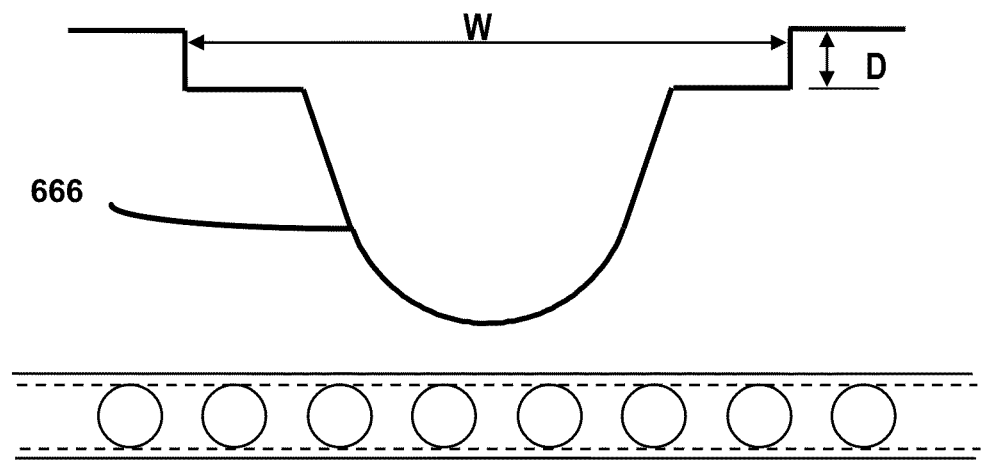
FIG. 6K is a cross sectional view of a cavity having a step in accordance with the teachings of the invention embodied herein.

FIG. 6K indicates a cavity 666 having a step that further clarifies elements of FIG. 6D. The step width (W) and depth (D) are chosen in a fashion as described, thus allowing for a particle fill the cavity with a greater chance of achieving one particle per cavity and a higher possibility of cavities being filled.

Figure 7A:
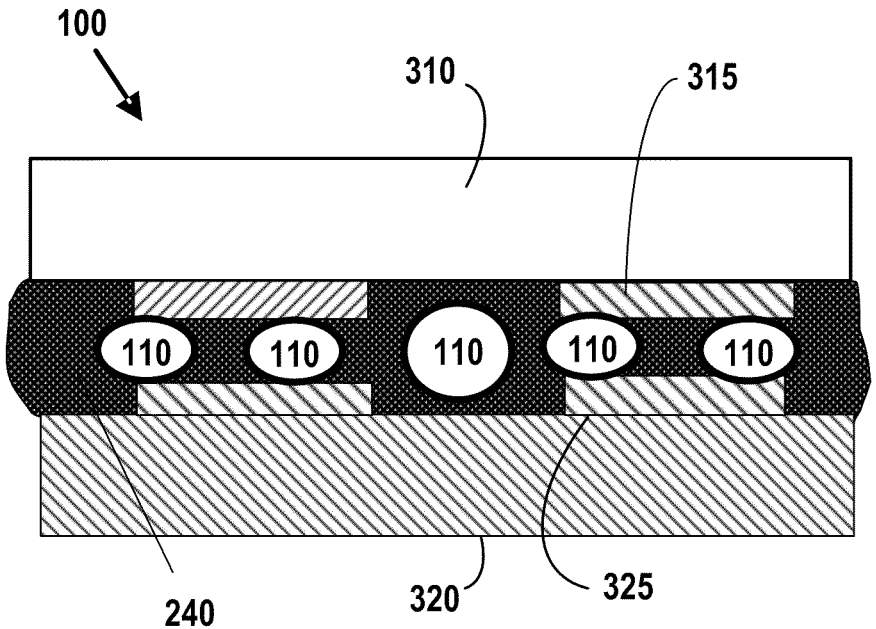
FIGS. 7A and 7B show the schematic drawings (not to scale) of the cross sectional views for a deformed conductive particle or filled microcavity after bonding of this invention for improve connection reliability.
Figure 7B:
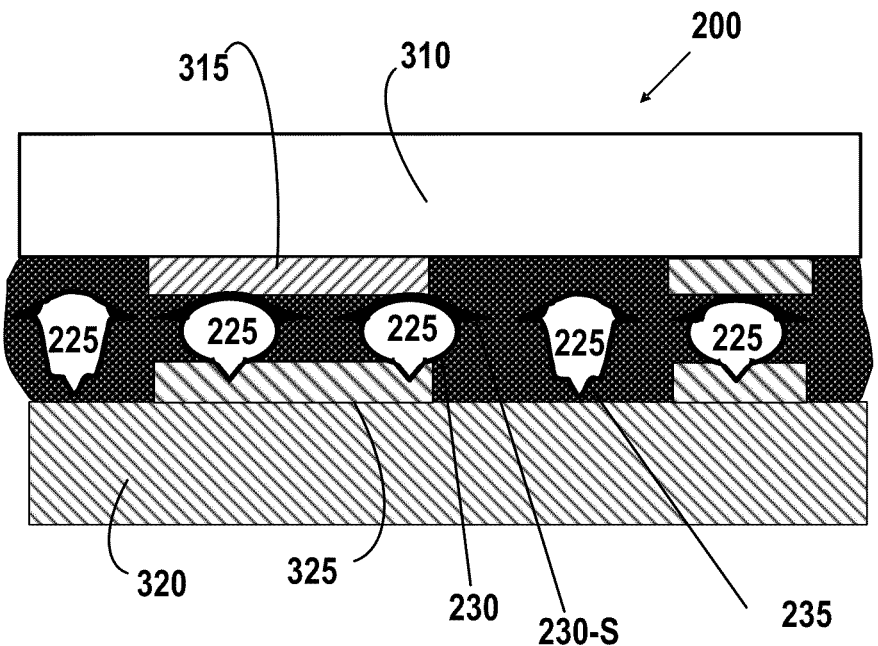

FIGS. 7A and 7B shows the actual application of the ACFs 100 and 200 respectively for providing electrically connections between a top (315) and bottom (325) electrodes attached to a top (310) and bottom (320) flexible printed circuit board (FPC) or chip-on-film (COF), respectively. In FIG. 7A, the conductive particles 110 with deformable elastic core are squeezed into an elliptic shape by the electrodes 315 and 325 and a vertical electric connection is established. In FIG. 7B, the microcavities (220, not marked), which can be filled with a deformable core (225), surrounded by the metallic shell (230) and bottom spikes (235) are pressed on by the top (315) and bottom electrodes (325). Optionally, a skirt top shell (230-S) may be used to provide broader contact areas, and the spike (235) can penetrate through a corrosive insulation layer that may develop on the surface of the electrodes 325, to assure better electrical contact.

Figure 8C:
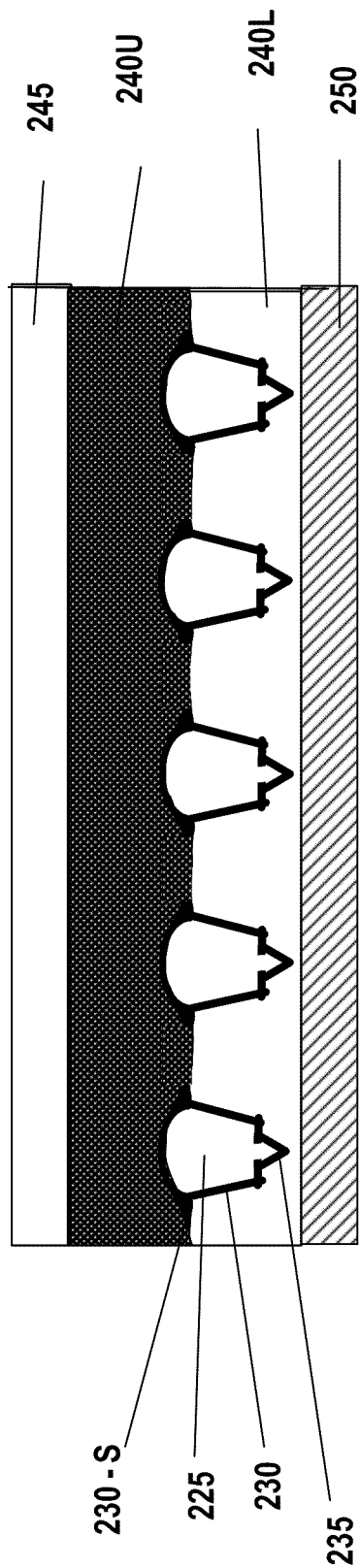

FIGS. 8A to 8C show different shapes of spikes (235) extended from the bottom surface of the metallic shell (230) of the microcavities (220, not marked). These spikes (235) may be formed as, without limitation, sharpened spikes, nodular, notches, wedges, or grooves. It is preferable that each metallic shell has a skirt shaped top cover (230-S), with an optimum skirt area for providing broader contact areas, to enhance electrical connections. A skirt area, which is too large, may result in a decrease in the number of conductive, filled microcavities per unit area, and an increase in the connection pitch size.

Figure 9:
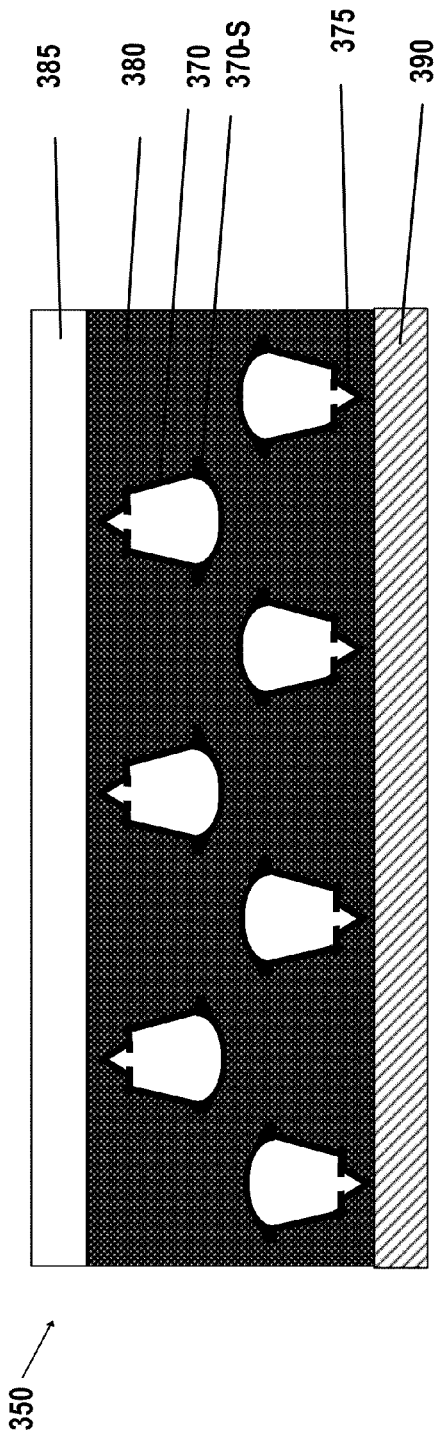
FIG. 9 shows the schematic drawing (not to scale) of a configuration of an ACF of the present invention comprising two non-random arrays of filled conductive microcavities, laminating face-to-face to form a sandwich structure such as Substrate-1/non-random array microcavities-1/adhesive/non-random array microcavities-2/Substrate-2.

FIG. 9 shows the cross sectional view of another preferred embodiment of this invention wherein an ACF (350) includes two non-random arrays of microcavities (360, not marked). Each of the microcavities has a metallic shell (370) and filled with deformable polymeric material. The metallic shell (370) has an optional skirt shaped cover (370-S) and spikes (375) extended from the bottom surface of the metal shell (370). The microcavities are disposed in an adhesive layer (380), which is sandwiched between top (385) and bottom (390) substrates, respectively.

The microcavities formed in FIGS. 3 and 4 above may be selectively metalized in designated area by methods including, but not limited to, those listed below:

(1) metallization through a shadow mask;

(2) coating a plating resist, photolithographic exposing, developing the resist and electroplating, particularly electroless plating the areas without the resist thereon; or (3) image-wise printing a plating resist, release, masking or plating inhibiting (poison) layer, non-imagewise metalizing the whole surface, followed by stripping or peeling off the metal on the unwanted areas.

Image-wise printing processes useful for the present invention can include, without limitation, an inkjet printing process, a gravure printing process, a letter press printing process, an offset printing process, a waterless offset printing process, or lithographic, thermal transfer, or laser ablative transfer printing processes.

Metallization processes useful for the present invention include, but are not limited to, a vapor deposition process, a sputtering process, an electrodeposition process, an electroplating process, an electroless plating process, or a replacement or an immersion plating process. Deposition of Ni/Au may be achieved by first activating the array surface with palladium followed by electroless Ni plating using an electroless Ni plating solution (from for example, Surface Technology Inc, Trenton, N.J.) and an immersion Au plating solution (for example from Enthone Inc.) to form interpenetrating Au/Ni layers. An Ag layer may also be electroless plated using for example, a substantially cyanide free Ag plating solution (for example, from Electrochemical Products Inc., New Berlin, Wis.) to form an interpenetrating Ni, Ag and Au layers.

Figure 10A:
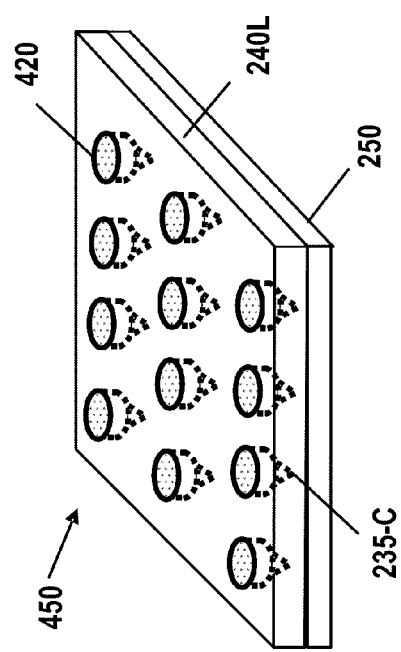
FIG. 10A is a schematic drawing of an array of microcavities with a spike substructure.

FIG. 10A shows an array (450) of microcavities (420) each with a spike cavity (235) extended from the bottom surface of the microcavities (220). The microcavity may comprise more than one spike with different orientations. The number, size, shape and orientation of the spikes in each microcavity are predetermined but may be varied from cavity to cavity. The microcavities with spike substructures may be manufactured by photolithography or microembossing using a shim or mold prepared, for example, by direct diamond turning, by laser engraving, or by photolithography followed by electroforming.

FIGS. 10B(1) through 10B(5) illustrate an ACF (200) fabrication process of one of the preferred embodiments of the present invention comprising the steps of:

(a) as shown in FIG. 10B(2), selectively metalizing the microcavity array (450) comprising a substrate (250), an adhesive (240L) and microcavities (420), optionally with spike cavities (235-C) by one of the methods discussed previously with the metallic layer coated over the sidewall surfaces (230) including the surface of the spike cavities (235-C) and preferably the top surface of the skirt areas (230-S) of the microcavities (420);

(b) as shown in FIG. 10B(3), filling an elastic deformable core material (225) into the metalized microcavities with the excess filling material removed outside of the microcavities (420);

(c) as shown in FIG. 10B(4), selectively metalizing the top (225-B) of the filling material (225) preferably with the a skirt edge of top-covering conductive metal layer also extending from the top surface of the deformable filling material (225) to the top surface areas surrounding the microcavities (220); and, (d) as shown in FIG. 10B(5), laminating the structure thus formed with an adhesive layer (240U) precoated on a substrate (445) to complete the fabrication of the ACF (200).

The adhesive (240U) may comprise materials including, but not limited to, epoxides, polyurethanes, polyacrylates, polymethacrylates, polyesters, polyamides, polyethers, phenolics, cellulose esters or ethers, rubbers, polyolefins, polydienes, cyanate esters, polylactones, polysulfones, polyvinyls and their monomers, oligomers, blends or composites. Among them, partially cured A-stage thermoset compositions comprising cyanate ester or epoxy resin, and a latent curing agent, are most preferred for their curing kinetics and adhesion properties.

To improve the rigidity of the spike (235), a rigid filler may be filled into the spike cavities (235-C) after the metallization step (a). Useful rigid fillers include, but are not limited to, silica, $TiO_2$, zirconium oxide, ferric oxide, aluminum oxide, carbon, graphite, Ni, and their blends, composites, alloys, nanoparticles or nanotubes. If the metallization step (a) is accomplished by electroplating, electroless plating, or electrodeposition, the rigid filler may be added during the metallization process. Useful deformable core materials (225) for the step (b) include, but are not limited to, polymeric materials such as polystyrene, polyacrylates, polymethacrylates, polyolefins, polydienes, polyurethanes, polyamides, polycarbonates, polyethers, polyesters, phenolics, aminoplastics, benzoguanamines, and their monomers, oligomers, copolymers, blends or composites. They may be filled into the microcavities in the form of solutions, dispersions, or emulsions. Inorganic or metallic fillers may be added to the core to achieve optimum physicomechanical and rheological properties. The surface tension of the core material (225) and the conductive shell of the microcavity and the skirt edge may be adjusted so that the core material form a bump shape (225-B) after the filling and the subsequent drying process. An expanding agent or a blowing agent may be used to facilitate the formation of the bump shape core. Alternatively, the core materials may be filled in on-demand by for example, an inkjet printing process. In the step (d), illustrated in FIG. 10B(5), the adhesive layer (240U) may be alternatively applied directly onto the array by coating, spraying or printing. The coated array may be used as the ACF or further laminated with a release substrate to form the sandwich ACF (200).

Figure 11A:
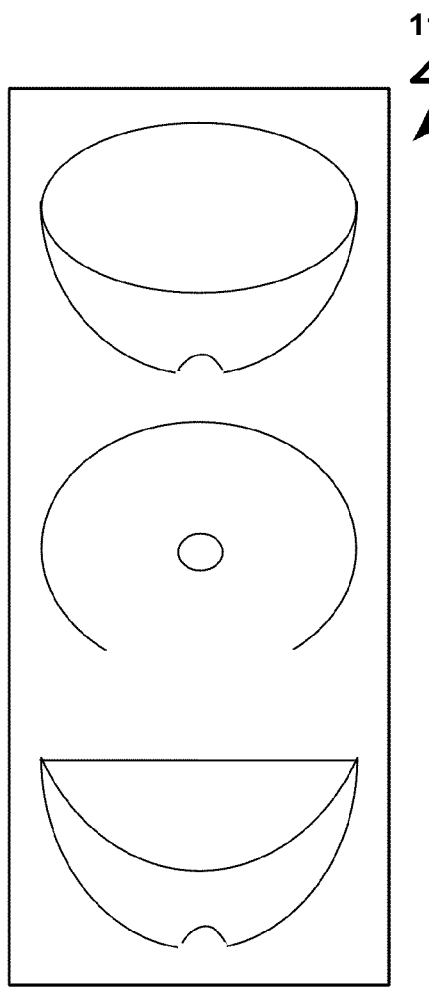
FIG. 11A is a first cross-sectional view of a previously shown microcavity, e.g., of FIG. 10(B)(1), including a rough surface in accordance with the teachings of the invention embodied herein.
Figure 11B:
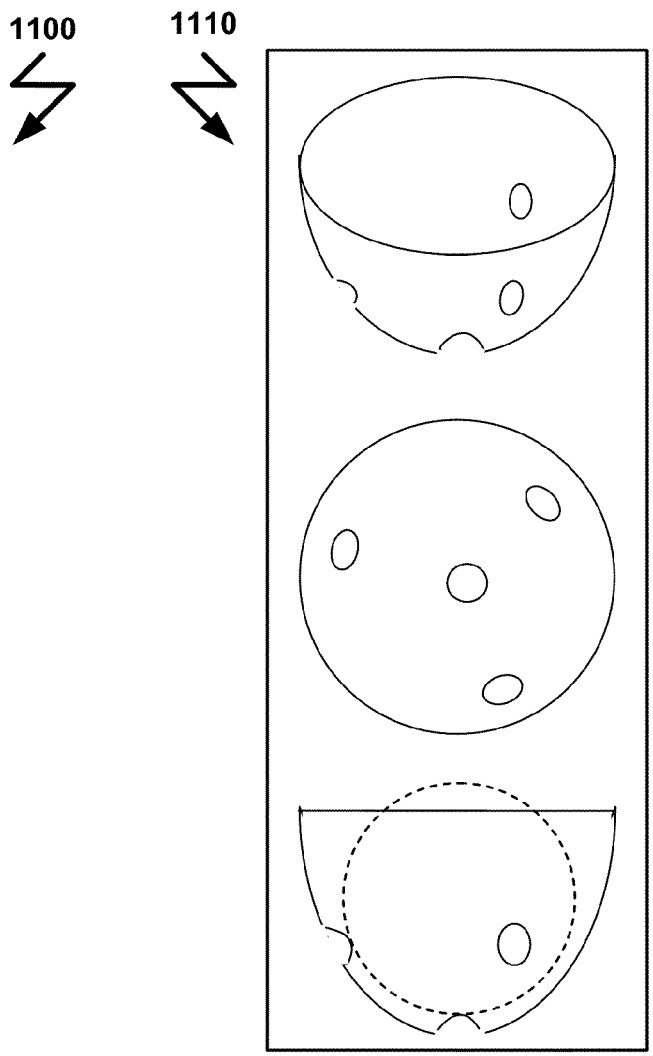
FIG. 11B is a second cross-sectional view of a previously shown microcavity, e.g., of FIG. 10(B)(1), including a rough surface in accordance with the teachings of the invention embodied herein.
Figure 11C:
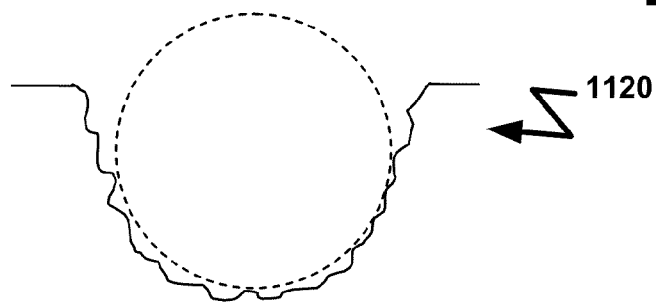
FIG. 11C is a third cross-sectional view showing another microcavity including a rough surface.

FIGS. 11A through 11C identify, as inherent and shown in the prior figures, how a rough surface can be utilized. FIG. 11A shows a rough surface 1100 having a single protruding bump, while FIG. 11B identifies a rough surface 1110 having a four such bumps, and FIG. 11C depicts a rough surface 1120 having a multitude of bumps. These bumps support the conductive particles to reduce the surface contacts between the conductive particle and the inner surface of the cavity. With less contact area, the transfer of the conductive particles becomes easier for there is less friction and adhesion force between the particle and the cavity. The distributed point contacts also improve the dimensional stability and thus extend the lifetime of the cavities. The bumps support the conductive particles and have a mean height of about 0.01 micron to about 2 micron, preferably about 0.1 micron to about 1.0 micron. Given the dynamics of the system using such sized particles, it is critical that the bump height have a standard deviation of less than about 10% of the mean.

EXAMPLES

The following examples are given to enable those skilled in the art to understand the present invention more clearly and to practice it. They should not be construed as the limits of the present invention, but should be considered as illustrative and representative examples. For the demonstration of the particle filling and transfer, two types of commercially available conductive particles (110) were used: the Ni/Au particles from Nippon Chemical through its distributor, JCI USA, in New York, a subsidiary of Nippon Chemical Industrial Co., Ltd., White Plains, N.Y. and the Ni particles from Inco Special Products, Wyckoff, N.J.

Generation of Microcavity Array Pattern on Polyimide Film by Laser Ablation

Two types of microcavity arrays were produced on letter size 8.5"×11", approximately 3-mil heat stabilized polyimide film (PI, 300 VN from Du Pont.) The targeted dimension of the microcavities was about 6 um (diameter)×about 2.0 um (partition)×about 4 um (depth) and about 6 um (diameter)× about 2.7 um (partition)×about 4 um (depth).

Preparation of the Adhesive Layer (120)

An approximately 30% stock dispersion of Min-U-Sil5 silica (a silica product from Western Reserve Chemical, Stow, Ohio) was prepared by dispersing about 28.44 parts of Min-U-Sil5 in a solution containing about 70 parts of isopropyl acetate (i-PrOAc), which also contains about 0.14 parts of BYK 322 (from BYK-Chemie USA, Wallingford, Conn.), about 0.71 parts of Silquest A186 and about 0.71 parts of Silquest A189 (both from GE Silicones, Friendly, West Va.). A stock dispersion of Cab-O-Sil-M5 (from Cabot) was prepared by dispersing about 10 parts of Cab-O-Sil-M5 in a solution containing about 86.6 parts of i-PrOAc, about 3 parts of HyProx UA11 (epoxy Bis-A-modified polyurethane from CVC Specialty Chemicals, Inc.), about 0.2 parts of Silquest A186 and about 0.2 parts of Silquest A189.

An approximately 60% stock solution of phenoxy binder PKHH (from Phenoxy Specialties, Rock Hill, S.C.) was prepared by dissolving about 60 parts of PKHH in a solution containing about 25 parts of acetone, about 11.25 parts of epoxy resin RSL 1462, and about 12.75 parts of epoxy resin RSL1739 (both from Hexion Specialty Chemicals, Inc., Houston, Tex.). To transfer particles from the microcavity carrier web (190), an adhesive composition (A) comprising the following ingredients was used: about 11.54 parts of epoxy resin RSL1462; about 13.07 parts of epoxy resin RSL 1739; about 27.65 parts of Epon resin165 (from Hexion Specialty Chemicals, Inc., Houston, Tex.); about 9.44 parts of HyProx UA11; about 7.5 parts of Min-U-sil5, and about 1.5 parts of Cab-o-sil-M5; about 0.22 parts of Silquest A186, about 0.22 parts of Silquest A189, about 15 parts of Paphen® phepoxy resin PKHH (SpecialChem, S.A., Paris, FR); about 0.3 parts of BYK322; and about 14 parts of HXA 3932 (a latent hardener microcapsule from Asahi Kasei, Japan). A release PET film, UV 50) from CPFilm) was corona treated and coated with a coating fluid containing about 50% by weight of the adhesive composition (A) in i-PrOAc by a Myrad bar to form the adhesive layer (120) with a targeted coverage of about 15 g/m2.

Surface Treatment of the Temporary Microcavity Carrier (190)

A microcavity array containing microcavities of about 6 um (diameter)×about 4 um (depth)×about 2 um (partition) was prepared by laser ablation on an approximately 3 mil heat-stabilized polyimide film (PI, from Du Pont) to form the microcavity carrier (190). To enhance the particle transfer efficiency, two types of surface treatments were employed.

Surface Treatment by FREKOTE®

The non-random-array microcavity carrier was cleaned with isopropanol (IPA), dried at about 60° C. in a conventional oven for about 1 min and coated with FREKOTE® 700-NC solution (from LOCTITE®) using a smooth rod with a target thickness of about 0.5 um. Excess material was wiped off from the rod with lint-free KIMWIPE® tissue. The coated film was allowed to dry in air for about 10 min, and then further dried in a conventional oven at about 60° C. for about 5 min. The surface treated substrate is ready to use for particles filling step.

TABLE 1

| Surface Treatment by NuSil fluorosilicones | | | |
|---|---|---|---|
| F-Silicone Medical Product | F-Silicone Nonmedical Product | Fluorine Content | Viscosity |
| MED400 | 3600 | Highest F | 100,000 cp 12,500 cp |
| MED420 | 3602 | Lowest F | 100,000 cp 12,500 cp |

Two fluorosilicones MED400 and MED420 were obtained from NuSil, LLC, Carpinteria, Calif. USA. The same surface treatment procedure for the PI microarray web was performed, except that in the place of FREKOTE® materials, each of the commercially available NuSil fluorosilicones fluids at a targeted thickness of about 0.2-0.3 um was used.

Particle Filling into Microcavity Array

An exemplary step-by-step procedure for particle filling is as follows: The surface treated PI microcavity array web was coated with a large amount of a conductive particle dispersion using a smooth rod. More than one filling may be employed to assure no unfilled microcavities. The filled microcavity array was allowed to dry at about room temperature for about 1 min, and the excess particles were wiped off gently by for example a rubber wiper or a soft lint-free cloth soaked with acetone solvent. Microscope images of the filled microcavity array were analyzed by ImageTool 3.0 software. A filling yield of more than about 99% was observed for all the microcavity arrays evaluated regardless of the type of surface treatment.

Transferring the Particles from the Microcavity Carrier (190) to the Adhesive Layer (120)

Two exemplary step-by-step procedures for particle transfer are as follows: Nickel particles: Adopting the particle filling procedure described in the above example, a surface-treated polyimide microcavity sheet with a 6×2×4 um array configuration was filled with about 4 um Umicore Ni particles. The attained percentage of particle filling was typically >about 99%. An epoxy film was prepared with about 15 um target thickness. The microcavity sheet and the epoxy film were affixed, face to face, on a steel plate. The steel plate was pushed through a HRL 4200 Dry-Film Roll Laminator, commercially available from Think & Tinker. The lamination pressure was set at a pressure of about 6 lb/in (about 0.423 g/cm2) and a lamination speed of about 2.5 cm/min. Particles were transferred from PI microcavity to epoxy film with an efficiency >about 98%. Acceptable tackiness during prebond at about 70° C. and conductivity after main bond at about 170° C. was observed after the resultant ACF film was bonded between two electrodes using a Cherusal bonder (Model TM-101P-MKIII.)

Gold Particles:

Similarly, a surface-treated polyimide microcavity sheet with an approximately 6×2×4 um array configuration was filled with monodispersed 4 um Au particles. The attained percentage of particle filling was also greater than about 99%. An epoxy film was prepared using a #32 wire bar with a targeted thickness of about 20 um. Both were placed on a steel plate face-to-face. The microcavity sheet and the epoxy film were affixed, face to face, on a steel plate. The steel plate was pushed through a HRL 4200 Dry-Film Roll Laminator, commercially available from Think & Tinker. The lamination pressure was set at a pressure of about 6 lb/in (or about 0.423 g/cm2) and a lamination speed of about 2.5 cm/min. An excellent particle transfer efficiency (greater than about 98%) was observed. The resultant ACF films showed acceptable tackiness and conductivity after bonded between two electrodes by the Cherusal bonder (Model TM-101P-MKIII.)

According to above descriptions, drawings and examples, this invention discloses an anisotropic conductive film (ACF) that includes a plurality of electrically conductive particles disposed in predefined non-random particle locations as a non-random array in or on an adhesive layer wherein the non-random particle locations corresponding to a plurality of predefined microcavity locations of an array of microcavities for carrying and transferring the electrically conductive particles to the adhesive layer. The conductive particles are transferred to an adhesive layer. Alternately this invention further discloses an anisotropic conductive film (ACF) that includes an array of microcavities, surrounded by an electrically conductive shell, and filled with a deformable core material for embodiment that includes deformable conductive particles having a conductive shell and a core. Typically, no transfer operation is necessary. In this case, the microcavity array is formed on an adhesive layer. Specifically, the process is carried out by directly coating an adhesive over the microcavity array filled with conductive particles, preferably with a deformable core and a conductive shell. Alternately, the microcavity may also be formed without being coated with an adhesive layer. The coated product could be used as the finished ACF product or preferably be laminated again with a release substrate. No transfer is need in this case. Furthermore, the ACF can be formed by particles that are prepared in situ on the microcavity, by metalizing the microcavity shell, filling a deformable material.

Different kinds of embodiments can be implemented for either the above types of ACF and the electronic devices implemented with the ACFs disclosed in this invention. In a specific embodiment, the electrically conductive particle or microcavity having a diameter or depth in a range between about one to about one hundred micrometers. In another preferred embodiment, the electrically conductive particle or microcavity having a diameter or depth in a range between about two to about ten micrometers. In another preferred embodiment, the electrically conductive particle or microcavity having a diameter or depth with a standard deviation of less than about 10%. In another preferred embodiment, the electrically conductive particle or microcavity has a diameter or depth with a standard deviation of less than about 5%. In another preferred embodiment, the adhesive layer comprises a thermoplastic, thermoset, or their precursors.

In another preferred embodiment, the adhesive layer comprises a pressure sensitive adhesive, a hot melt adhesive, or a heat-, a moisture- or a radiation-curable adhesive. In another preferred embodiment, the adhesive layer comprises an epoxide, phenolic resin, amine-formaldehyde resin, polybenzoxazine, polyurethane, cyanate esters, acrylics, acrylates, methacrylates, vinyl polymers, rubbers such as poly(styrene-co-butadiene) and their block copolymers, polyolefines, polyesters, unsaturated polyesters, vinyl esters, polycaprolactone, polyethers, or polyamides.

In another preferred embodiment, the adhesive layer comprises an epoxide, phenolic, polyurethane, polybenzoxazine, cyanate ester or multifunctional acrylate. In another preferred embodiment, the adhesive layer comprises a catalyst, initiator or curing agent. In another preferred embodiment, the adhesive layer comprises a latent curing agent activatable by heat, radiation, pressure of a combination thereof. In another preferred embodiment, the adhesive layer comprises an epoxide and a curing agent selected from the list comprising dicyanodiamide (DICY), adipic dihydrazide, 2-methylimidazole, and its encapsulated products, such as Novacure HX dispersions in liquid bisphenol A epoxy, from Asahi Chemical Industry, amines such as ethylene diamine, diethylene triamine, triethylene tetraamine, BF3 amine adduct, Amicure from Ajinomoto Co., Inc, sulfonium salts such as diaminodiphenylsulphone, p-hydroxyphenyl benzyl methyl sulphonium hexafluoroantimonate.

In another preferred embodiment, the adhesive layer comprises one of a multifunctional acryalate, a multifunctional methacrylatye, a multifunctional allyl, a multifunctional vinyl, or a multifunctional vinyl ether, and one of a photoinitiator or a thermal initiator. In another preferred embodiment, the adhesive layer further comprises a coupling agent. In another preferred embodiment, the adhesive layer further comprises a coupling agent, particularly titanate, zirconate, or silane coupling agent, such as, without limitation, gamma-glycidoxypropyl trimethoxysilane, or 3-aminopropyl trimethoxysilane, or titanium coupling agent. In another preferred embodiment, the adhesive layer further comprises an electrically insulating filler particle such as, without limitation, silica, TiO2, Al2O3, boron nitride, or silicon nitride.

The invention further discloses a non-random array anisotropic thermally conductive adhesive film and its manufacturing processes that include the steps of fluidic filling thermally conductive but electrically insulating particles onto a microcavity array followed by transferring the particles to an adhesive layer. The invention further discloses the use of a non-random array anisotropic thermally conductive adhesive film to connect an electronic device, particularly a semiconductor or display device. Conventionally, the anisotropic conductive film (ACF) is only related to the use of electrical conductive particles. However, in this invention, the conductive particle may be also thermally conductive to enhance thermal management. Furthermore, for particular applications, the particles may also be thermally conductive but electrically insulating particles. For different applications, the particles may also be thermally conductive and electrically conductive particles. Therefore, a method for manufacturing an ACF is disclosed wherein the method of placing a plurality of conductive particles into an array of microcavities comprising a step of employing a fluidic particle distribution process to entrap each of the conductive particles into a single microcavity. In a preferred embodiment, the method further includes a step of employing a roll-to-roll continuous process for carrying the step of placing a plurality of conductive particles into an array of microcavities followed by transferring the conductive particles to an adhesive layer. In another preferred embodiment, the method further includes a step of applying an embossing, laser ablation, or photolithographic process before the step of placing the plurality of conductive particles into the array of microcavities. In another preferred embodiment, the step of applying the embossing, laser ablation or photolithographic process on a microcavity forming layer is before the step of placing the plurality of conductive particles into the array of microcavities.

In another preferred embodiment, the method further includes a step of employing a microcavity array coated with a release layer. The release layer may be selected from the list comprising fluoropolymers or oligomers, silicone oil, fluorosilicones, polyolefines, waxes, poly(ethyleneoxide), poly (propyleneoxide), surfactants with a long-chain hydrophobic block or branch, or their copolymers or blends. The release layer is applied to the microcavity array by methods including, but are not limited to, coating, printing, spraying, vapor deposition, plasma polymerization or cross-linking. In another preferred embodiment, the method further includes a step of employing a close loop of microcavity array. In another preferred embodiment, the method further includes a step of employing a cleaning device to remove residual adhesive or particles from the microcavity array after the particle transfer step. In a different embodiment, the method further includes a step of applying a release layer onto the microcavity array before the particle filling step.

The invention further discloses an anisotropic conductive film that includes an array of conductive particles or microcavities disposed in predefined locations in an adhesive material between two substrate films. The substrate could be a conductive or insulating material. It is only to support the adhesive/conductive particles or microcavity array, and the substrate is then removed when the ACF is applied to connect devices. In a preferred embodiment, the microcavities are of substantially the same size and shape. Alternately, the ACF includes an array of microcavities filled with a deformable material each surrounded by a conductive cell disposed between a top and bottom substrate films. The core material may either be conductive or non-conductive depending on the specific applications for the ACF.

In a specific embodiment, the invention further discloses a method for fabricating an electric device. The method includes a step of placing a plurality of electrically conductive particles that include an electrically conductive shell and a core material into an array of microcavities followed by overcoating or laminating an adhesive layer onto the filled microcavities. In a preferred embodiment, the step of placing a plurality of conductive particles into an array of microcavities comprising a step of employing a fluidic particle distribution process to entrap each of the conductive particles into a single microcavity. In another preferred embodiment, the method further includes a step of depositing or coating an electrically conductive layer on selective areas of an array of microcavities followed by filling the coated microcavities with a deformable composition and forming a conductive shell around the microcavities. In a preferred embodiment, the top conductive layer shell is electrically connected to the conductive layer on the microcavities.

In another preferred embodiment, the selective areas comprise the surface of microcavities. In another preferred embodiment, the selective areas further comprise a skirt area of the microcavities. In another preferred embodiment, the skirt area is an area on the top surface of the microcavity array and extended from the edge of the microcavity. In another preferred embodiment, the skirt area is about 0.05 um to about 20 um extended from the edge of the microcavities. In another preferred embodiment, the skirt area is about 0.1 to about 5 um extended from the edge of the microcavities. In another preferred embodiment, the conductive layer is deposited or coated by vapor deposition, sputtering, electroplating, electroless plating, electrodeposition or wet coating. In another preferred embodiment, the conductive layer is formed of a metal, metal alloy, metal oxide, carbon or graphite. In another preferred embodiment, the metal is Au, Pt, Ag, Cu, Fe, Ni, Co, Sn, Cr, Al, Pb, Mg, or Zn. In another preferred embodiment, the metal oxide is indium tin oxide or indium zinc oxide. In another preferred embodiment, the electrically conductive layer is formed of carbon nano tube.

In general, a nanoparticle can be sized between about 1 nanometer and about 100 nanometers. Similarly, a nanotube can be a substantially cylindrically-shaped entity having one or more walls, and which may be constituted on one or more nanoparticles. In another preferred embodiment, the electrically conductive layer comprises multiple layer or interpenetrating layer of different metals. In another preferred embodiment, the deformable composition comprises a polymeric material. In another preferred embodiment, the polymeric material is selected from the list comprising polystyrene, polyacrylates, polymethacrylates, polyvinyls, epoxy resins, polyesters, polyethers, polyurethanes, polyamides, phenolics, polybenzoxazine, polydienes, polyolefins, or their copolymers or blend. In another preferred embodiment, the core material of the conductive particles comprises a polymer and a filler.

In another preferred embodiment, the filler is selected from the list comprising nano particles or nano tubes of carbon, silica, Ag, Cu, Ni, TiO2 and clay are preferred as the filler in the core. In another preferred embodiment, the filler is a substantially electrically conductive filler. In another preferred embodiment, the step of filling an array of microcavities with the deformable material comprising a step of filling the array of microcavities with a polymeric composition followed by selectively depositing or coating an electrically conductive layer on the filled microcavities to form an electrically conductive shell. In another preferred embodiment, the method further includes a step of employing a roll-to-roll continuous process for carrying the step of depositing or coating an electrically conductive layer over selective areas of an array of microcavities followed by filling the microcavities with a deformable composition and forming a conductive shell around the microcavities.

In another preferred embodiment, the step of deposition or coating a conductive layer on selective areas is accomplished by a method selected from the steps that may includes process of: a) metallization through a shadow mask; or b) coating a plating resist, photolithographic exposing, developing the resist and furthermore electroplating, particularly electroless plating the areas without the resist thereon. The method further includes a step of image-wise printing a plating resist, release, masking or plating inhibitor layer, non-imagewise metalizing the whole surface, followed by stripping or peeling off the metal on the unwanted areas. In another preferred embodiment, the deposition or coating an conductive layer on selective areas is accomplished by a method selected from the processes of a) metallization through a shadow mask, b) coating a plating resist, photolithographic exposing, developing the resist and electroplating, particularly electroless plating the areas without the resist thereon, or c) image-wise printing a plating resist, release, masking or plating inhibitor layer, non-imagewise metalizing the whole surface, followed by stripping or peeling off the metal on the unwanted areas.

In another preferred embodiment the step of image-wise printing process is a process selected from the list comprising inkjet, gravure, letter press, offset, waterless offset or lithographic, thermal transfer, laser ablative transfer printing processes. In another preferred embodiment, the method further includes a step of applying a roll-to-roll continuous process for forming an array of microcavities by an embossing or photolithographic process before the step of depositing or coating an electrically conductive layer on selective areas. In another preferred embodiment, the embossing or photolithographic process is accomplished on a microcavity-forming layer. In another preferred embodiment, the microcavities further comprise a substructure within the microcavity.

In another preferred embodiment, the sub-structure is a form of spike, notch, groove, and nodule. In another preferred embodiment, the sub-structure is filled with a rigid, electrically conductive composition before the step of depositing or coating an electrically conductive layer onto selective areas of the microcavity array. In another preferred embodiment, the rigid, electrically conductive composition comprises a metal or carbon or graphite particle or tube. In another preferred embodiment, the metal particle is a metal nano particle. In another preferred embodiment, the metal particle is a nickel nano particle. In another preferred embodiment, the electrically conductive particle further includes carbon nano particle or carbon nano tube.

According to above descriptions, drawings and examples, this invention further discloses a non-random ACF array that may include more than one set of microcavities either on the same or opposite side of the adhesive layer, with the microcavities typically having predetermined size and shape. In one particular embodiment, the microcavities on the same side of the adhesive film have substantially same height in the z-direction (the thickness direction). In another embodiment, the microcavities on the same side of the adhesive film have substantially same size and shape. The ACF may have more than one set of microcavities even on the same side of the adhesive as long as their height in the vertical direction is substantially the same to assure good connection in the specific applications of the ACF. The microcavities may be substantially on one side of the anisotropic conductive adhesive film.

Furthermore, an embodiment discloses an electrically conductive material, filling microcavities, with spikes pointing toward one side of the adhesive film. In an alternate embodiment, this invention further includes an anisotropic conductive adhesive film that includes two arrays of filled electrically conductive microcavities, one on each side of the conductive adhesive. In a specific embodiment, these two arrays comprise microcavities of substantially the same size, shape and configuration. In another preferred embodiment, these two arrays include microcavities of different size, shape or configuration. In another preferred embodiment, these two arrays are aligned in a staggered way to allow no more than one filled microcavities in the z-direction (the thickness direction) of any horizontal position.

In addition to the above embodiment, this invention further discloses an electronic device with electronic components connected with an ACF of this invention wherein the ACF has non-random conductive particle array arranged according to one, or a combination of more than one, of the processing methods, as described above. In a particular embodiment, the electronic device comprises a display device. In another embodiment, the electronic device comprises a semiconductor chip. In another embodiment, the electronic device comprises a printed circuit board with printed wire. In another preferred embodiment, the electronic device comprises a flexible printed circuit board with printed wire.

Moreover, in addition to the above embodiments, this invention further discloses a non-random ACF microarray, which can be provided in a unimodal implementation, in a bimodal implementation, or in a multimodal implementation. In an embodiment of a unimodal particle implementation, particles in a non-random ACF microcavity array can have a particle size range distributed about a single mean particle size value, typically between about 2 um to about 6 um, with embodiments featuring a narrow distribution including a narrow particle size distribution having a standard deviation of less than about 10% from the mean particle size. In other embodiments featuring a narrow distribution, a narrow particle size distribution may be preferred to have a standard deviation of less than about 5% from the mean particle size. Typically, a cavity of a selected cavity size is formed to accommodate a particle having a selected particle size that is approximately the same as the selected cavity size.

Thus, in a unimodal cavity implementation, microcavities in a non-random ACF microcavity array can have a cavity size range distributed about a single mean cavity size value, typically between about 2 um to about 6 um, with embodiments featuring a narrow distribution including a narrow cavity size distribution having a standard deviation of less than 10% from the mean cavity size. In other embodiments featuring a narrow distribution, a narrow cavity size distribution may be preferred to have a standard deviation of less than 5% from the mean cavity size.

In a bimodal particle implementation of a non-random ACF microcavity array, ACF particles can have two ACF particle size ranges, with each ACF particle type having a corresponding mean ACF particle size value, with a first mean ACF particle size being different from a second mean ACF particle size. Typically, each mean ACF particle size can be between about 2 um to about 6 um. In some embodiments of a bimodal particle implementation, each mode corresponding to respective mean ACF particle size values may have a corresponding narrow particle size distribution. In some selected embodiments, a narrow particle size distribution can be characterized by having a standard deviation of less than 10% from the mean particle size. In other selected embodiments, a narrow particle size distribution can be characterized by having a standard deviation of less than 5% from the mean particle size.

In one non-limiting example of a bimodal ACF particle implementation, a first ACF particle type may be selected to have a first mean particle size of about 3 μm, and a first ACF particle distribution having a standard deviation of about 10% from the first mean ACF particle size. A second ACF particle type, different from the first particle type, may be selected to have a second mean particle size of about 5 µm, and a second ACF particle distribution having a standard deviation of about 5% from the second mean ACF particle size. In another non-limiting example of a bimodal ACF particle implementation, a first ACF particle type can be electrically conductive, which has a corresponding first mean ACF particle size and a first ACF particle distribution, and a second ACF particle type can be electrically non-conductive but thermally conductive; which has a corresponding second mean ACF particle size and a second ACF particle distribution. Typically, a bimodal ACF microcavity array can be formed having a first mean ACF cavity size and a first ACF cavity distribution to accommodate the first ACF particle type; and having a second mean ACF cavity size and a second ACF cavity distribution to accommodate the second ACF particle type.

In a bimodal cavity implementation of a non-random ACF microcavity array, ACF microcavities can have two ACF cavity size ranges, with each ACF cavity type having a corresponding mean ACF cavity size value, with a first mean ACF cavity size being different from a second mean ACF cavity size. Typically, each mean ACF particle size can be between about 2 um to about 6 um. In some embodiments of a bimodal cavity implementation, each mode corresponding to respective mean ACF cavity size values may have a corresponding narrow ACF cavity size distribution. In some selected embodiments, a narrow ACF cavity size distribution can be characterized by having a standard deviation of less than 10% from the mean ACF cavity size. In other selected embodiments, a narrow ACF cavity size distribution can be characterized by having a standard deviation of less than 5% from the mean ACF cavity size.

In a multimodal non-random ACF microcavity array, three or more ACF particle types can be provided, with each respective ACF particle type having a different ACF particle size from another, with respective mean ACF particle sizes ranging from about 1 µm to about 10 µm. Typically, each ACF particle type (and, by extension, ACF mean particle size) in a multimodal ACF microcavity array can be provided in a respective wide ACF particle size distribution, for example, having a standard deviation of less than 20% of the respective mean particle size. In some embodiments employing a multimodal distribution, one or more of the mean ACF particle sizes may have a corresponding narrow ACF particle size distribution, such as, without limitation, having a standard deviation of less than 10% of the respective mean ACF particle size or having a standard deviation of less than 5% of the respective mean ACF particle size.

In a multimodal non-random ACF microcavity array, three or more ACF cavity types can be provided, with each respective ACF cavity type having a different ACF cavity size from another, with respective mean ACF cavity sizes ranging from about 1 µm to about 10 µm. Typically, each ACF cavity type (and, by extension, ACF mean cavity size) in a multimodal ACF microcavity array can be provided in a respective wide ACF cavity size distribution, for example, having a standard deviation of less than 20% of the respective mean cavity size. In some embodiments employing a multimodal distribution, one or more of the mean ACF cavity sizes may have a corresponding narrow ACF cavity size distribution, such as, without limitation, having a standard deviation of less than 10% of the respective mean ACF cavity size or having a standard deviation of less than 5% of the respective mean ACF cavity size.

Furthermore, in light of all of the foregoing, this invention additionally discloses the use of diverse non-random ACF particles, which particles may vary in one, or more, of shape, structure, physical characteristics, or composition, for each respective mode (with each mode being representative of an ACF particle size). Each mode correspond to one ACF particle type and mean ACF particle size. In general, different ACF particle types may differ, respectively, in one or more of: particle composition, particle shape, particle surface asperity type or distribution, or in an electrical, a thermal, a chemical, or a mechanical property of an ACF particle. Similarly, different ACF cavity types may differ, respectively, in one or more of: cavity shape, cavity surface asperity type or distribution, or in an electrical, a thermal, a chemical, or a mechanical property of material in which an ACF cavity is formed. An "asperity" in this context means a relatively localized projection on the surface of the particle or of the cavity.

"Composition" of a particle or cavity material may include, without limitation, one or more of a chemical composition, a structural composition, an electrical property, a thermal property, a rheological property, a deformability characteristic, a resilience characteristic, an adhesion property, a thermosetting property, a compression property, a reliability characteristic, or any other measurable characteristics, which may be used to vary the overall properties or functionality of an ACF particle, an ACF microcavity, or both. In addition, composition may refer to a combination of compositions, properties or both. Structural composition may be with respect to a two-dimensional shape, a three-dimensional shape, the presence (or absence) of a rim, a bevel, an overhang, a surface spike, a bump, a depression, a recess, or another asperity or structural configuration. Structural composition also may pertain to particle core type, type or number of particle surface coatings, and a particle or cavity surface texture.

Adhesion properties may include, without limitation, one or more of cohesive strength, bonding strength, peel strength, damping capacity, damping resistance, elastic modulus, elastic strength, flexibility, physical shock resistance, polymer chain entanglement, cross-linking, or polymerization. Thermosetting properties may include, without limitation, one or more of degree of cross-linking, nature of polymerization, nature of branching, cross-linking, cure temperature, cure time, or stiffness. Adhesion properties and thermosetting properties may overlap. Furthermore, in some embodiments, one or more preselected modifiers may be used to impart a desirable characteristic or property upon a particle or a cavity, or to adjust a preselected characteristic or property, for example, to accommodate an ambient or environmental condition. Such modifiers may include, without limitation, a preselected adhesive modifier, a preselected thermoset modifier, a preselected rheology modifier, a preselected stiffness modifier, or a preselected reliability enhancer.

In an embodiment of a fabrication process for a multimodal non-random ACF microcavity array, particles may be selected to provide a first ACF particle type having a first mean ACF particle size with a first ACF particle distribution, a second ACF particle type having a second mean ACF particle size with a second ACF particle distribution, and a third ACF particle type having a third mean ACF particle size with a third ACF particle distribution. In this example, the second ACF particle type has a larger mean ACF particle size than the first ACF particle type, and the third ACF particle type has a larger mean ACF particle size than the second ACF particle type. To manufacture such multimodal non-random ACF array, a multimodal microcavity array may be formed by selectively forming on an ACF microcavity array substrate to receive the aforementioned three ACF particle types, a first cavity type having a first mean ACF cavity size, a second cavity type having a second mean ACF cavity size, and a third cavity type having a third mean ACF cavity size. One method of manufacture can include applying the larger, third-type ACF particles to the microcavity array, followed by applying the intermediate, second-type ACF particles to the microcavity array, followed by applying the smaller, first-type ACF particles to the multimodal ACF microcavity array. The ACF particles may be applied using one or more of the aforementioned array-forming techniques.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

We claim:

1. A method for fabricating an electric device comprising: placing one of a plurality of conductive particles of narrow particle size distribution into a respective microcavity of a microcavity array of narrow cavity size distribution by employing a closed loop roll-to-roll continuous fluidic particle distribution process to entrap each of the respective ones of the plurality of conductive particles into a single microcavity on a temporary closed loop web including the step of placing the plurality of conductive particles into the array of microcavities using a contact push process; and transferring the plurality of conductive particles from the microcavity array on the temporary closed loop web to predefined locations in the adhesive layer, wherein a distance between the transferred adjacent conductive particles is greater than the percolation threshold corresponding to the plurality of conductive particles, wherein one or both of the narrow particle size distribution or the narrow cavity size distribution has a standard deviation of less than about 10%.

2. The method of claim 1, wherein one or both of the narrow particle size distribution or the narrow cavity size distribution has a standard deviation of less than about 5%.

3. The method of claim 1 further comprising: employing a non-contact vibration assisted fluid particle distribution process with the roll-to-roll distribution process, prior to transferring the conductive particles to the predefined locations in the adhesive layer.

4. The method of claim 3, wherein the non-contact vibration is achieved by at least one of a mechanical wave source, an electrical wave source, a magnetic wave source, an acoustic wave source, or an ultrasonic wave source; and wherein the vibration frequency emitted by the vibration source is between about 250 Hz to about 60,000 Hz.

5. The method of claim 1, further comprising: employing a contact push process for placing the plurality of conductive particles into the array of microcavities, using at least one of seamless felt, a doctor blade, or a smooth bar prior to transferring the conductive particles to the adhesive layer.

6. The method of claim 5 further comprising: employing a contact push process using seamless felt for placing the plurality of conductive particles into the array of microcavities, prior to transferring the conductive particles to the adhesive layer.

7. The method of claim 1 further comprising: employing a cleaning process for removing excess conductive particles from an upper surface of the microcavity array using at least one of a contact cleaning process or a non-contact cleaning process, wherein the non-contact cleaning process includes at least one of a suction cleaning process, an air blow cleaning process, or a solvent spray cleaning process, wherein the contact cleaning process includes applying at least one of a seamless felt cleaning process, a wiper cleaning process, an adhesive cleaning process, or a tacky roll cleaning process, and wherein the cleaning process further comprises applying suction for recycling conductive particles.

8. The method of claim 7, further comprising: employing a non-contact particle cleaning process to remove excess particles by applying a suction cleaning process, wherein a suction force is applied directly on the upper surface of the microcavity array.

9. The method of claim 8, further comprising: dispensing one of a cleaning fluid, a solvent, or a solvent mixture on the upper surface of the microcavity array.

10. The method of claim 8 further comprising: employing a contact particle cleaning process by applying a seamless felt surface in at least partial contact with the upper surface of the microcavity array.

11. The method of claim 8 further comprising: applying a suction to the upper surface of the microcavity array for recycling conductive particles from the seamless felt surface, and refreshing the seamless felt surface.

12. The method of claim 7, wherein the contact cleaning process comprises: removing particles from the upper surface of the microcavity array by applying a seamless felt surface using a capillary force of the seamless felt and a suction force applied to the seamless felt surface opposite the upper surface of the microcavity array surface, substantially simultaneously removing excess particles and recycling conductive particles.

13. The method of claim 12, further comprising: dispensing additionally at least one of a cleaning fluid, a solvent, or a solvent mixture for assisting the suction cleaning process.

14. The method of claim 1, wherein the cohesion strength of said adhesive layer is no less than one of the adhesion strength between the adhesive layer and microcavity array, the adhesion strength between the adhesive layer and conductive particle, or the adhesion between the adhesive layer and the release liner that carries the adhesive layer.

15. The method of claim 1, wherein the in the roll-to-roll process, the web is removed from the adhesive layer at a peeling angle in the range of between about 30 degrees to about 90 degrees.

16. The method of claim 1, wherein the surface temperature of the adhesive layer during the particle transfer process is in the range of between about 15° C. to about 600° C.

17. The method of claim 1, further comprising: transferring the plurality of conductive particles from the microcavity array to predefined locations in the adhesive layer by applying a pressure in the range of between about 0.1 megapascals to about 100 megapascals.

18. The method of claim 14, wherein a Young's modulus of the adhesive layer is in the range of between about 0.1 megapascals to about 10 megapascals.

19. The method of claim 14, wherein an adhesive modulus is adjusted by residual solvent in the adhesive, a transfer temperature, or both.

20. The method of claim 14 wherein an adhesive layer includes a release liner side and an adhesive side opposite the release liner side, and wherein the method further comprises: providing more than one modulus gradient across a thickness of an adhesive layer, wherein a higher modulus is disposed on the release liner side and lower modulus is disposed on the adhesive side.

21. The method of claim 20, wherein providing the more than one modulus gradients is achieved by introducing a trace amount of solvent from conductive particle distribution process, by introducing a temperature gradient introduced during transfer process, or both.

22. The method of claim 21, wherein the temperature gradient is provided by employing a surface heating source, employing a heat sink on the release liner, or both.

23. The method of claim 22, wherein the surface heating sources comprises one or more of a heated roll heating source, an infrared heating source, a hot air heating source, or a wire heating source.

24. The method of claim 1, wherein transferring the plurality of conductive particles from the microcavity array to an adhesive layer comprises transferring the plurality of conductive particles using a differential shear process between the adhesive layer and the microcavity array.

25. The method of claim 24, wherein the differential shear process comprises applying a web speed differentiation between an adhesive-coated release liner and the microcavity array.

26. The method of claim 25, wherein the web speed of the adhesive-coated release liner is greater than the web speed of the microcavity array.

27. The method of claim 25, wherein the web speed of the adhesive-coated release liner is less than the web speed of the microcavity array.

28. The method of claim 1, wherein the adhesion strength between the adhesive layer and a substrate film is greater than the adhesion strength between the adhesive layer and a microcavity array film.

29. The method of claim 28, wherein the adhesion strength of the microcavity array film is controlled by a release coating corona treatment.

30. The method of claim 1, wherein the conductive particles are partially embedded in the adhesive layer.

31. The method of claim 1, wherein the adhesive layer is disposed on a first substrate.

32. The method of claim 31, further comprising a second substrate disposed on the adhesive layer opposite the first substrate.

33. The method of claim 32, wherein the adhesion strength between the adhesive layer and at least one of the first substrate or the second substrate is less than the cohesion strength of the adhesive layer.

34. The method of claim 31, wherein one or both of the substrates further comprise a release layer between the adhesive and the respective substrate.

35. The method of claim 32, wherein an adhesion force to the adhesive layer of one of the first substrate or the second substrate is greater than the adhesion force to the adhesive layer of the other substrate.

36. The method of claim 1, wherein after transferring the conductive particles the adhesive layer has one of a viscosity gradient or a modulus gradient built across a thickness of the adhesive layer.

37. The method of claim 1, wherein after transferring the conductive particles, the surface of the adhesive layer bearing the conductive particles possesses at least one of a higher viscosity or a higher modulus.

38. The method of claim 36, wherein the viscosity gradient across adhesive layer is formed by applying a heating process comprising one or more of a surface radiation heating process, a heated roll heating process, an infrared heating process, a UV heating process.

39. The method of claim 1, further comprising forming a microcavity having a top opening with an internal circular area with a diameter approximately equivalent to the diameter of a conductive particle, wherein the internal circular area is disposed at a location in the top opening, and wherein substantially no other internal circular area is provided with a diameter approximately equal to or larger than the diameter of the conductive particle.

40. The method of claim 1, wherein a depth of the microcavity has a mean cavity depth of between about 0.4 times to about 1.8 times the diameter of the conductive particle, and wherein the depth of the microcavity cavity has a standard deviation of less than about 10% of the mean cavity depth.

41. The method of claim 40, wherein the depth of the microcavity cavity has a standard deviation of less than about 5% of the mean cavity depth.

42. The method of claim 1, further comprising forming the microcavity with a wall extending from the top opening to a bottom of the microcavity, wherein the wall is disposed with inclined angles substantially between about 0 degrees to about 30 degrees.

43. The method of claim 1, further comprising
forming a the microcavity having a top opening having an internal circular area with a diameter approximately equivalent to the diameter of a conductive particle, wherein the internal circular area is disposed at a location in the top opening, and wherein substantially no other internal circular area is provided with a diameter approximately equal to or larger than the diameter of the conductive particle, wherein a depth of the microcavity has a mean cavity depth of between about 0.4 times to about 1.8 times the diameter of the conductive particle, and wherein the depth of the microcavity cavity has a standard deviation of less than about 10% of the mean cavity depth.

44. The method of claim 1, further comprising:
forming the microcavity having a top opening having an internal circular area with a diameter approximately equivalent to the diameter of a conductive particle, wherein the internal circular area is disposed at a location in the top opening, and wherein substantially no other internal circular area is provided with a diameter approximately equal to or larger than the diameter of the conductive particle, and
forming the microcavity having a wall extending from the top opening to a bottom of the microcavity, wherein the wall is disposed with inclined angles substantially between about 0 degrees to about 30 degrees.

45. The method of claim 1, wherein forming the microcavity further comprises:
forming the microcavity to have a mean cavity depth being between about 0.4 to about 1.8 times of the diameter of the conductive particle, and the cavity depth having a standard deviation less than about 10% of the mean cavity depth, and
forming the microcavity with a wall having inclined angles extending from the top opening to the bottom of the microcavity, with the inclined angles being substantially between about 0 degrees to about 30 degrees.

46. The method of claim 1, further comprising:
forming the microcavity having a top opening having an internal circular area with a diameter approximately equivalent to the diameter of the conductive particle, wherein the internal circular area is disposed at a location inside the top opening, and there exists substantially no other internal circular area with a diameter approximately equal to or larger than the diameter of the conductive particle, and forming the microcavity having a mean cavity depth being between about 0.4 times to about 1.8 times of the diameter of the conductive particle, and the cavity depth having a standard deviation of less than about 10% of the mean cavity depth, and forming the microcavity having a wall extending from the top opening to the bottom of the microcavity, with the wall having inclined angles substantially between about 0 degrees to about 30 degrees.

47. The method of claim 39, wherein the top opening is formed in substantially circular shape with a diameter less than about 2 times of the diameter of the conductive particle, and wherein the diameter of the circular opening has a standard deviation less than about 10% of the mean particle diameter.

48. The method of claim 39, wherein the top opening is formed in a substantially elliptical shape, having a minor elliptical diameter less than about 1.732 times of the diameter of the conductive particle and having a major elliptical diameter less than about 2 times of the diameter of the conductive particle, and wherein the minor elliptical diameter and major elliptical diameter are disposed with a standard deviation of less than about 10% of the mean particle diameter.

49. The method of claim 39, wherein the top opening is formed in substantially square shape with each side of the square shape being less than about 1.707 times of the diameter of the conductive particle, and wherein each side of the opening is substantially square with a standard deviation less than about 10% of the mean particle diameter.

50. The method of claim 39, wherein the top opening is formed in substantially rectangular shape with a length (L) of the top opening being generally greater than a width (W) thereof, wherein a mean width of the rectangular top opening is less than about 1.7 times the diameter of conductive particle, and wherein the sum of L and W is approximate less than about 3 times the diameter of the conductive particle, and wherein each of L and the W of the rectangular opening has a standard deviation of less than about 10% of the mean particle diameter.

51. The method of claim 39, wherein the top opening is formed in substantially hexagonal shape providing a hexagonal opening with a width less than about 1.86 times the diameter of a conductive particle, and wherein the height of the hexagonal opening has a standard deviation of less than about 10% of the mean particle diameter.

52. The method of claim 39, wherein the top opening is formed in substantially equilateral triangle shape providing a equilateral triangle opening with a side width less than about {square root over √3+1 times the diameter of the conductive particle, wherein the side of the equilateral triangle opening has a standard deviation of less than about 10% of the mean particle diameter.

53. The method of claim 1, further comprising:
forming a trench structure in the array of microcavities a trench structure, wherein the trench structure is disposed substantially on top of a row of the microcavities, wherein forming the trench structure includes forming the trench structure with a mean trench width of between about between about 1.1 times to about 2.0 times the diameter of a microcavity, wherein the trench width has a standard deviation of less than about 10% of the mean trench width, and forming the trench structure with a mean trench depth of between about 0.2 micron to about 2.0 micron, with the trench depth having a standard deviation of less than about 10% of the mean trench depth.

54. The method of claim 1, further comprising:
forming a trench structure in the array of microcavities a trench structure, wherein the trench structure is disposed substantially on top of a row of the microcavities, wherein forming the trench structure includes forming the trench structure with a mean trench width of between about between about 1.2 times to about 1.8 times the diameter of a microcavity, wherein the trench width has a standard deviation of less than about 10% of the mean trench width, and forming the trench structure with a mean trench depth of between about 0.5 micron to about 1.5 micron, with the trench depth having a standard deviation of less than about 10% of the mean trench depth.

55. The method of claim 1, further comprising:
forming a microcavity rough cavity surface having at least one protruding bump disposed to contact and support a conductive particle, wherein the at least one protruding bump has a mean height of between about 0.01 micron to about 2 micron, and wherein the protruding bump height has a standard deviation of less than about 10% of the mean height.

56. The method of claim 1, further comprising:
forming a microcavity rough cavity surface having at least one protruding bump disposed to contact and support a conductive particle, wherein the at least one protruding bump has a mean height of between about between about 0.1 micron to about 1.0 micron, and wherein the protruding bump height has a standard deviation of less than about 10% of the mean height.

57. The method of claim 1, further comprising:
forming a space between adjacent microcavities, wherein a distance between the adjacent microcavities is generally greater than the distance of a percolation threshold corresponding to the plurality of conductive particles.

58. The method of claim 1, further comprising:
forming a bowl shaped bottom with curved bottom surface wherein the bottom surface has a radius of between about 0.2 to about 5.0 times the radius of the conductive particles.

59. The method of claim 1, further comprising:
forming a bowl shaped bottom with curved bottom surface wherein the bottom surface has a radius of between about 0.8 to about 2.0 times the radius of the conductive particles.

60. The method of claim 1 further comprising:
forming the microcavity array employing a roll-to-roll continuous process before placing the conductive particles into the microcavity array, wherein the roll-to-roll continuous process is one of an embossing process, a laser ablation process, or a photolithographic process.

61. The method of claim 1 further comprising:
forming the microcavity array employing a roll-to-roll continuous process on one of a microcavity-forming layer or substrate before placing the conductive particles into the microcavity array, wherein the roll-to-roll continuous process is one of an embossing process, a laser ablation process, or an imagewise patterning process.

62. The method of claim 1,
wherein ones of plurality of conductive particles exhibit a first narrow particle size distribution and having a first mean particle size, wherein others of the plurality of conductive particles exhibit a second narrow particle size distribution and having a second mean particle size generally less than the first mean particle size, wherein ones of the plurality of microcavities on a microcavity array exhibit a first narrow cavity size distribution and having a first mean cavity size, wherein others of the plurality of microcavities on the microcavity array exhibit a second narrow cavity size distribution and having a second mean cavity size generally less than the first mean cavity size, wherein the particle size distributions exhibit a bimodal particle distribution, wherein the cavity size distributions of the microcavity array exhibit a bimodal cavity distribution;

wherein the ones and the others are collectively designated the bimodal particles;

wherein a roll-to-roll continuous fluidic particle distribution process disposes larger ones of the plurality of conductive particles onto the microcavity array having a bimodal cavity size distribution, followed by disposing the smaller others of the plurality of conductive particles onto the microcavity array of bimodal cavity size distribution;

wherein at least one of the ones or the others of the bimodal particle distribution is electrically conductive; and wherein each microcavity of the microcavity array designated for conductive particles is shaped and sized to allow only one the conductive particle to be entrapped in each microcavity of the microcavity array.

63. The method of claim 62, wherein a first bimodal particle further comprises an electrically conductive bimodal particle, and a second bimodal particle further comprises an electrically non-conductive and thermally conductive bimodal particle.

64. The method of claim 62, wherein a first bimodal particle being electrically conductive and having a first particle size and a second bimodal particle being electrically conductive and having a second particle size, wherein the first particle size is different from the second particle size.

65. The method of claim 62, said one of the bimodal particles is a rheology modifier.

66. The method of claim 61 wherein the image-wise patterning process comprises one of a photolithographic process, a holographic printing process, a transfer printing process, an imprinting process, or a diamond turning process, and wherein the roll-to-roll continuous process further comprises one of an etching process or a forming process.

67. The method of claim 61, wherein the laser ablation process further comprises:
generating a laser beam for ablation having power in the range of between about 0.1 W/cm$^2$ to about 200 W/cm$^2$;
employing a pulsing frequency being between about 0.1 Hz to about 500 Hz; and
applying between about 1 pulse to about 100 pulses.

68. The method of claim 61, wherein the laser ablation process further comprises:
generating a laser beam for ablation having power in the range of between about 1 W/cm$^2$ to about 100 W/cm$^2$;
employing a pulsing frequency being between about 1 Hz to about 100 Hz; and
applying between about 10 pulses to about 50 pulses.

69. The method of claim 61 further comprising:
supplying carrier gas blowing at the ablation area having a flow rate of between about 0.1 liter per minute to about 50 liter per minute, wherein the blowing employs a debris removal apparatus including an air blowing unit.

70. The method of claim 61 further comprising:
supplying carrier gas blowing at the ablation area having a flow rate of between about 1 liter per minute to about 20 liter per minute, wherein the blowing employs a debris removal apparatus including an air blowing unit.

71. The method of claim 61,
wherein the laser ablation process employs a sacrificial overcoat on the ablation substrate to improve an ablated microcavity shape or dimension or both,
wherein the sacrificial overcoat is removable;
wherein sacrificial overcoat is one of a metal, a ceramic, or an organic material; and
wherein removing the sacrificial overcoat selectively includes a water solvent wash.

72. The method of claim 1, further comprising:
selectively metalizing ones of the microcavity arrays.

73. The method of claim 1, wherein the placing further comprises:
selectively metallizing the array of microcavities;
filling the array with a filler material;
selectively secondly metallizing the microcavity array having filler material; and
one of
over-coating the microcavity array, or
laminating the array with an adhesive film.

* * * * *

UNITED STATES PATENT AND TRADEMARK OFFICE
CERTIFICATE OF CORRECTION

| | | |
|---|---|---|
| PATENT NO. | : 8,802,214 B2 | Page 1 of 1 |
| APPLICATION NO. | : 12/608955 | |
| DATED | : August 12, 2014 | |
| INVENTOR(S) | : Liang et al. | |

It is certified that error appears in the above-identified patent and that said Letters Patent is hereby corrected as shown below:

In the Claims

In Claim 15, Column 30, Line 45, delete:

"wherein the in the roll-to-roll"

should read:

-- wherein in the roll-to-roll --

Signed and Sealed this
Twenty-first Day of October, 2014

Michelle K. Lee
*Deputy Director of the United States Patent and Trademark Office*